United States Patent
Hara et al.

(10) Patent No.: US 10,326,470 B2
(45) Date of Patent: Jun. 18, 2019

(54) CONVERTER FOR CONVERTING CODE-MODULATED POWER WITH CONVERSION CODE, AND CONTROLLER THEREOF

(71) Applicant: Panasonic Intellectual Property Management Co., Ltd., Osaka (JP)

(72) Inventors: Shoichi Hara, Tokyo (JP); Atsushi Yamamoto, Kyoto (JP); Taiki Nishimoto, Osaka (JP); Kohei Masuda, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 437 days.

(21) Appl. No.: 15/347,062

(22) Filed: Nov. 9, 2016

(65) Prior Publication Data

US 2017/0163281 A1  Jun. 8, 2017

(30) Foreign Application Priority Data

Dec. 3, 2015 (JP) .................................. 2015-236547

(51) Int. Cl.
 *H03M 5/14* (2006.01)
 *H02J 13/00* (2006.01)
 *H03M 5/04* (2006.01)

(52) U.S. Cl.
 CPC ......... *H03M 5/145* (2013.01); *H02J 13/0027* (2013.01); *H03M 5/04* (2013.01)

(58) Field of Classification Search
 CPC ....... H03M 5/04; H03M 5/145; H02J 13/0027
 See application file for complete search history.

(56) References Cited

U.S. PATENT DOCUMENTS

| | | | |
|---|---|---|---|
| 9,641,188 B1 * | 5/2017 | Yamamoto | H03M 1/0617 |
| 9,966,939 B2 * | 5/2018 | Yamaoka | H02M 7/4807 |
| 9,979,437 B2 * | 5/2018 | Yamamoto | H04B 3/542 |
| 10,122,289 B2 * | 11/2018 | Yamaoka | H02M 5/297 |
| 2004/0066094 A1 | 4/2004 | Suzuki et al. | |
| 2012/0185708 A1 | 7/2012 | Rekimoto et al. | |

FOREIGN PATENT DOCUMENTS

| | | |
|---|---|---|
| JP | 10-014244 | 1/1998 |
| JP | 2006-254694 | 9/2006 |
| JP | 2011-091954 | 5/2011 |
| JP | 2013-138612 | 7/2013 |
| JP | 2014-017942 | 1/2014 |
| JP | 2014-224857 | 12/2014 |

OTHER PUBLICATIONS ip.com version of JP H11-242526A. Printed Mar. 15, 2019.*

* cited by examiner

*Primary Examiner* — Fritz M Fleming
(74) *Attorney, Agent, or Firm* — McDermott Will & Emery LLP

(57) ABSTRACT

A converter includes: a terminal that receives code-modulated power that has been generated with a modulation code; and a circuit that intermittently converts the code-modulated power with a conversion code based on the modulation code. The code-modulated power is alternating-current power.

15 Claims, 21 Drawing Sheets

CONVERTER FOR CONVERTING CODE-MODULATED POWER WITH CONVERSION CODE, AND CONTROLLER THEREOF

BACKGROUND

1. Technical Field

The present disclosure relates to a code modulator, a code demodulator or a converter, a controller, and a power transmission system including the same.

2. Description of the Related Art

In recent years, installing a local, small-scale power grid has been proposed in order to reduce losses due to long-distance power transmission. A power source (e.g., a renewable-energy power source) connected to such a power grid has a lower power-generating capability than a core power source for a large-scale commercial power grid and tends to have large variations in the power-generating capability. Thus, in order to stably and efficiently utilize energy in the small-scale power grid, there are demands for a power transmission system that can transmit and receive power with high transmission efficiency.

Japanese Patent No. 5612718 discloses a multi-terminal power conversion apparatus for asynchronously and flexibly supplying power.

Japanese Unexamined Patent Application Publication No. 2011-91954 discloses a power supply apparatus including a communication unit that transmits/receives information signals to/from another apparatus and a power-supply unit that supplies power to the other apparatus.

SUMMARY

In one general aspect, the techniques disclosed here feature a converter including: a terminal that receives code-modulated power that has been generated with a modulation code; and a circuit that intermittently converts the code-modulated power with a conversion code based on the modulation code. The code-modulated power is alternating-current (AC).

It should be noted that comprehensive or specific embodiments may be implemented as a power transmission system, a power transmission method, a code modulator, a code demodulator, or an integrated circuit.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
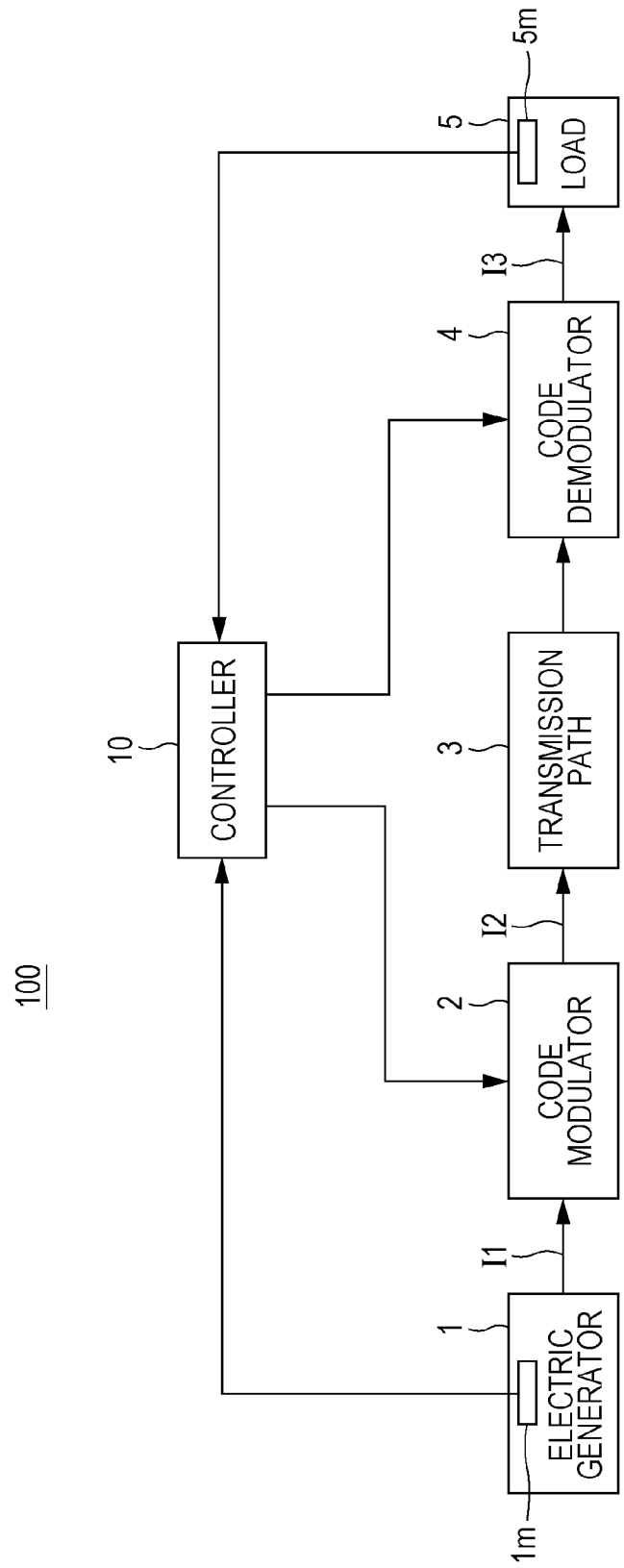
FIG. 1 is a block diagram illustrating an example configuration of a power transmission system according to a first reference mode.

Reference modes and embodiments according to the present disclosure will be described below with reference to the accompanying drawings. In each embodiment described below, the same or similar constituent elements are denoted by the same reference numerals and/or the same names.

Various modes described below all represent comprehensive or specific examples. Numerical values, codes, waveforms, the types of element, the arrangement and connection of elements, signal flows, circuit blocks, and so on described below are examples and are not intended to limit the present disclosure. In addition, constituent element not set forth in the independent claims that represent the broadest concept are optional constituent elements.

First Reference Mode

[1. Power Transmission System]

FIG. 1 illustrates the configuration of a power transmission system 100 according to a first reference mode. The power transmission system 100 includes an electric generator 1, a code modulator 2, a transmission path 3, a code demodulator 4, a load 5, and a controller 10.

The electric generator 1 generates electric power (e.g., direct-current (DC) power). The code modulator 2 code-modulates the generated power with a modulation code to thereby generate code-modulated power (i.e., a code-modulated wave). The code-modulated power is transmitted from the code modulator 2 to the code demodulator 4 through the transmission path 3. The transmission path 3 is, for example, a wired transmission line. The code demodulator 4 code-demodulates the code-modulated power with a demodulation code to thereby obtain power (e.g., DC power). The obtained power is supplied to, for example, the load 5.

The modulation code and the demodulation code each are a signal including a predetermined code sequence.

The code-modulated power is AC power. In the present disclosure, the "AC power" refers to power whose flow direction reverses periodically or aperiodically and whose current average value and/or voltage average value become(s) generally 0 in a sufficiently long period of time. The current (or voltage) average value being generally 0 means that the absolute value of the current (or voltage) average value after the code modulation is smaller than a predetermined value. This predetermined value is a value obtained by, for example, dividing the maximum value of a current (or a voltage) before the code modulation by the code length of the modulation code. The AC power has, for example, a waveform whose polarity changes at every predetermined period (e.g., a period corresponding to an integer multiple of a unit period).

The electric generator 1 has, for example, a power measuring instrument 1m. The power measuring instrument 1m measures the amount of electricity generated by the electric generator 1 and transmits the measured amount of electricity generated to the controller 10. The amount of electricity generated corresponds to, for example, the amount of power transmitted from the electric generator 1 to the code modulator 2. The power measuring instrument 1m may be provided at a stage prior to the code modulator 2.

The load 5 has, for example, a power measuring instrument 5m. The power measuring instrument 5m measures the amount of power used by the load 5 and transmits the measured amount of power used to the controller 10. The amount of power used corresponds to, for example, the amount of power transmitted from the code demodulator 4 to the load 5. The power measuring instrument 5m may be provided at a stage subsequent to the code demodulator 4.

Each of the electric generator 1 and the load 5 may be, for example, a power storage device, such as a battery or a capacitor. In this case, for example, power generated in a time slot in which the amount of power consumption is small can be stored, and the stored power can be effectively used. This makes it possible to enhance the power efficiency of the entire system.

The controller 10 receives information about the measured amounts of power and controls the operations of the code modulator 2 and the code demodulator 4 on the basis of the corresponding amounts of power. For example, the controller 10 transmits instruction signals to the code modulator 2 and the code demodulator 4.

The instruction signals include a synchronization signal for making the operation of the code modulator 2 and the operation of the code demodulator 4 synchronize with each other. The instruction signals transmitted to the code modulator 2 include, for example, timing information indicating a timing at which the generated power is to be code-modulated, and the instruction signals transmitted to the code demodulator 4 include, for example, timing information indicating a timing at which the code-modulated power is to be code-demodulated. This makes it possible to cause the code modulation and the code demodulation of power to synchronize with each other accurately.

The instruction signals transmitted to the code modulator 2 include, for example, code information regarding the modulation code, and the instruction signals transmitted to the code demodulator 4 include, for example, code information regarding the demodulation code. In the present disclosure, the "code information" may be a code sequence itself, may be designation information for designating a specific one of a plurality of code sequences, or may be parameter information for generating a code sequence.

For example, the controller 10 may transmit a code sequence of a modulation code to the code modulator 2 and may transmit a code sequence of a demodulation code to the code demodulator 4.

For example, the controller 10 may transmit designation information that designates a code sequence of a modulation code to the code modulator 2, and the code modulator 2 may generate a modulation code on the basis of the designation information. The controller 10 may transmit designation information that designates a code sequence of a demodulation code to the code demodulator 4, and the code demodulator 4 may generate a demodulation code on the basis of the designation information.

Alternatively, the modulation code may be pre-set in the code modulator 2, and the demodulation code may be pre-set in the code demodulator 4.

Now, suppose a case in which the power transmission system 100 includes a plurality of electric generators 1, a plurality of code modulators 2, a plurality of code demodulators 4, and a plurality of loads 5, by way of example. In this case, for example, the controller 10 transmits the code information regarding the modulation code to one code modulator 2 selected from the plurality of code modulators 2 and transmits the code information regarding the demodulation code to one code demodulator 4 selected from the plurality of code demodulators 4. This allows power to be transmitted from the electric generator 1 connected to the selected code modulator 2 to the load 5 connected to the selected code demodulator 4.

FIG. 1 illustrates a generated current I1, a code-modulated current I2, and a code-demodulated current I3, instead of the generated power, the code-modulated power, and the code-demodulated power. Although an example in which a current is modulated and demodulated is described below, the present disclosure is not limited thereto, and for example, a voltage may be modulated and demodulated. The "current" in the description below can be read instead as a "voltage" or "power", as appropriate.

[2. Transmission Efficiency of Code-Modulated Power]

Figure 2:
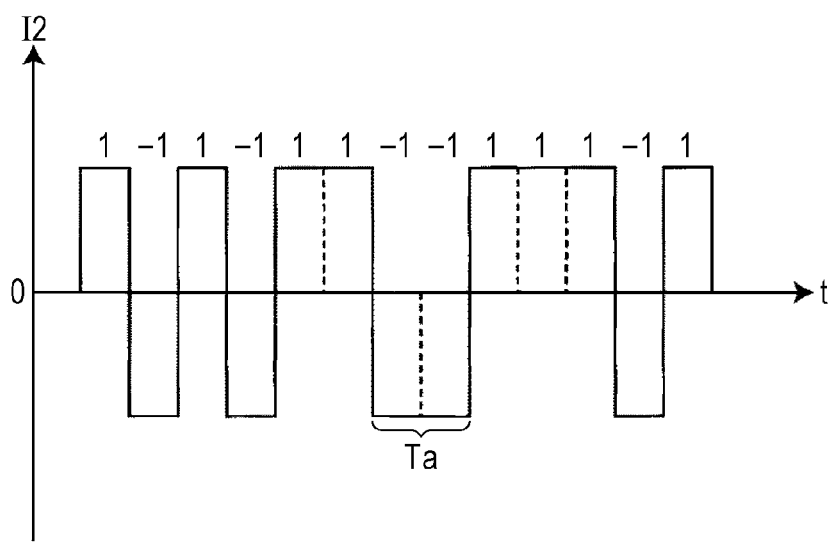
FIG. 2 is a diagram illustrating one example of the waveform of a modulated current according to the first reference mode.
Figure 3:
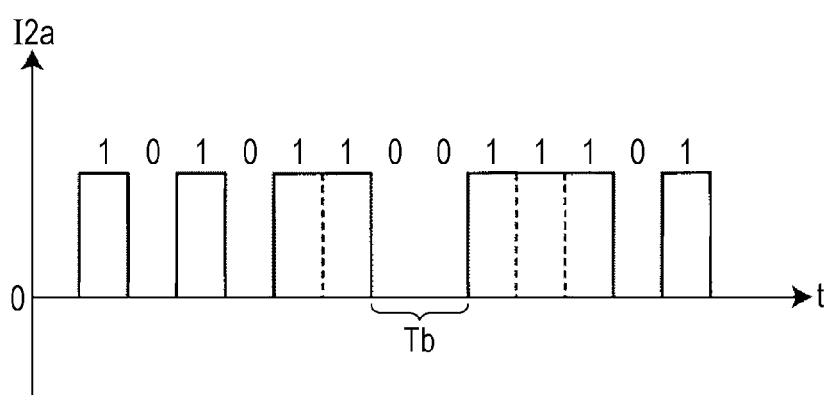
FIG. 3 is a diagram illustrating an example of the waveform of a modulated current according to a comparative example.

FIG. 2 illustrates an example of the waveform of the modulated current I2. FIG. 3 illustrates an example of the waveform of a modulated current I2a according to a comparative example. In FIGS. 2, 1s and −1s represent values constituting a modulation code, the values corresponding to the current values of the modulated current I2 in corresponding periods. In FIG. 3, 1s and 0s represent values constituting a modulation code, the values corresponding to the current values of the modulated current I2a in corresponding periods. A code sequence consisting of 0s and 1s corresponds to a modulation code used in a typical communication system.

In the example illustrated in FIG. 2, the code modulator 2 converts the generated current I1 into a modulated wave (i.e., the modulated current I2) having "1s" and "−1s". Thus, the modulated current I2 is AC. In this case, in each period in which the modulated current I2 indicates "1", positive current is transmitted from the code modulator 2 to the code demodulator 4, and in each period in which the modulated current I2 indicates "−1" (e.g., a period Ta in FIG. 2), negative current is transmitted from the code modulator 2 to the code demodulator 4. Thus, power is transmitted in all periods, thereby realizing high transmission efficiency.

In the example illustrated in FIG. 3, the modulated current I2a has a modulated wave having "1s" and "0s" and is not AC. In this case, in a period in which the modulated current I2a indicates "0" (e.g., a period Tb in FIG. 3), the modulated current I2a becomes zero, and thus no power is transmitted. Thus, when the code-modulated power is not AC power, the power transmission efficiency decreases.

Comparison between FIG. 2 and FIG. 3 shows that power can be transmitted with high transmission efficiency when the code-modulated power is AC power, particularly, when the code sequence of the modulation code does not include "0".

[3. Code Modulation and Demodulation of DC Power]

Figure 4A:
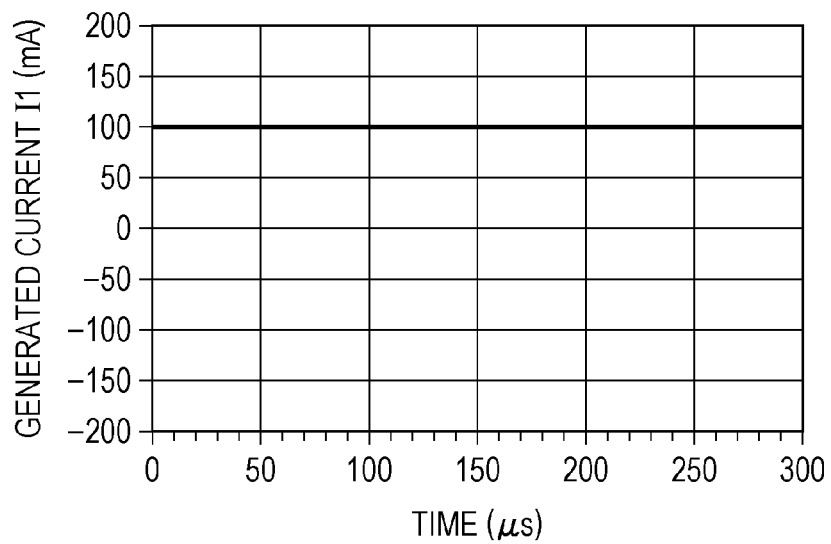
FIG. 4A is a graph illustrating one example of the waveform of the generated current according to the first reference mode.
Figure 4B:
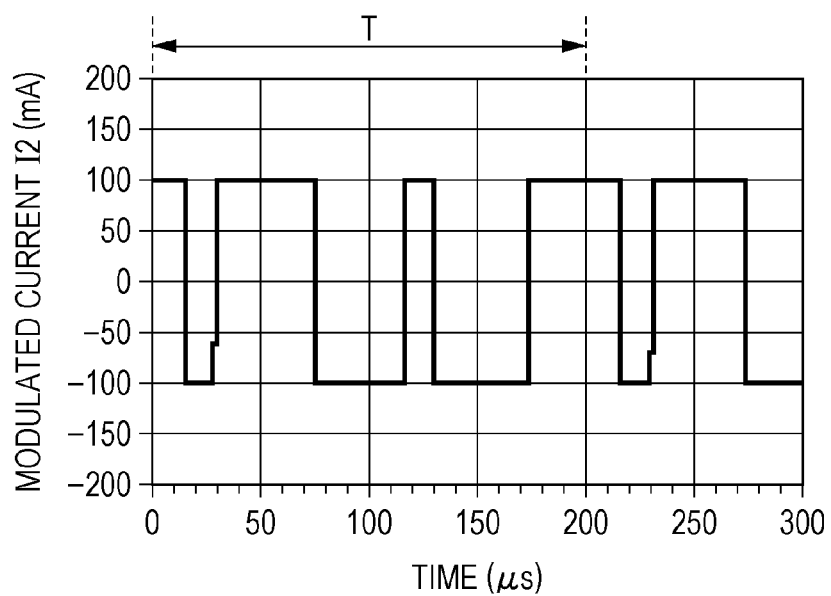
FIG. 4B is a diagram illustrating one example of the waveform of the modulated current according to the first reference mode.
Figure 4C:
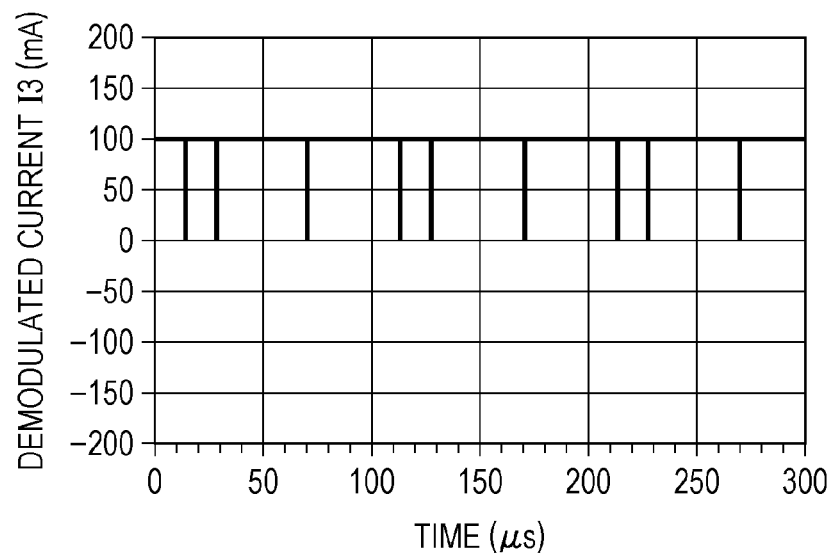
FIG. 4C is a diagram illustrating one example of the waveform of the demodulated current according to the first reference mode.

FIGS. 4A to 4C illustrate examples of the waveforms of the generated current I1, the modulated current I2, and the demodulated current I3, respectively.

The generated current I1 illustrated in FIG. 4A was DC.

The modulated current I2 illustrated in FIG. 4B was obtained by multiplying the generated current I1 by a modulation code M1. In this example, the modulation code M1 had a code sequence given by:

$$M1=[1\text{-}1\ 1\ 1\ 1\text{-}1\text{-}1\text{-}1\ 1\text{-}1\text{-}1\text{-}1\ 1\ 1] \quad (1)$$

The frequency of the modulation code was 35 kHz, and the time span of each value constituting the modulation code was about 14.3 (={1/(35 kHz)}/2) μs. A period T illustrated in FIG. 4B represents one cycle of the code sequence of the modulation code M1.

The demodulated current I3 illustrated in FIG. 4C was obtained by multiplying the modulated current I2 with a demodulation code D1. In this example, the modulation code M1 and the demodulation code D1 had the same code sequence. That is, the demodulation code D1 had a code sequence given by:

$$D1=[1\text{-}1\ 1\ 1\ 1\text{-}1\ \text{-}1\text{-}1\ 1\text{-}1\text{-}1\text{-}1\ 1\ 1] \quad (2)$$

In this case, the frequency of the demodulation code was 35 kHz, and the time span of each value constituting the demodulation code was about 14.3 μs.

A result obtained by multiplying the modulated current I2 by the demodulation code D1 corresponds to a result obtained by multiplying the generated current I1 by M1×D1. In this case, M1×D1 has a code sequence given by:

$$M1\times D1=[1\ 1\ 1\ 1\ 1\ 1\ 1\ 1\ 1\ 1\ 1\ 1\ 1\ 1] \quad (3)$$

Thus, as illustrated in FIG. 4C, a DC equivalent to the generated current I1 was restored as the demodulated current I3 through the code modulation and the code demodulation.

As described above, the modulation and demodulation method according to this reference mode makes it possible to realize low-loss power transmission through accurate synchronization.

For example, when the modulation code M1 is repeatedly used in the manner illustrated in FIG. 4B, power can be transmitted with high efficiency for a long period of time.

In the above-described example, the eighth to 14th values of the modulation code M1 respectively correspond to values obtained by reversing the polarities of the first to seventh values of the modulation code M1. When such a modulation code is used, the average of the modulated current I2 becomes 0, thus making it possible to realize transmission with only AC that is free of DC components. Thus, it is possible to transmit power with high transmission efficiency.

[4. Code Modulator and Code Demodulator]

Figure 5:
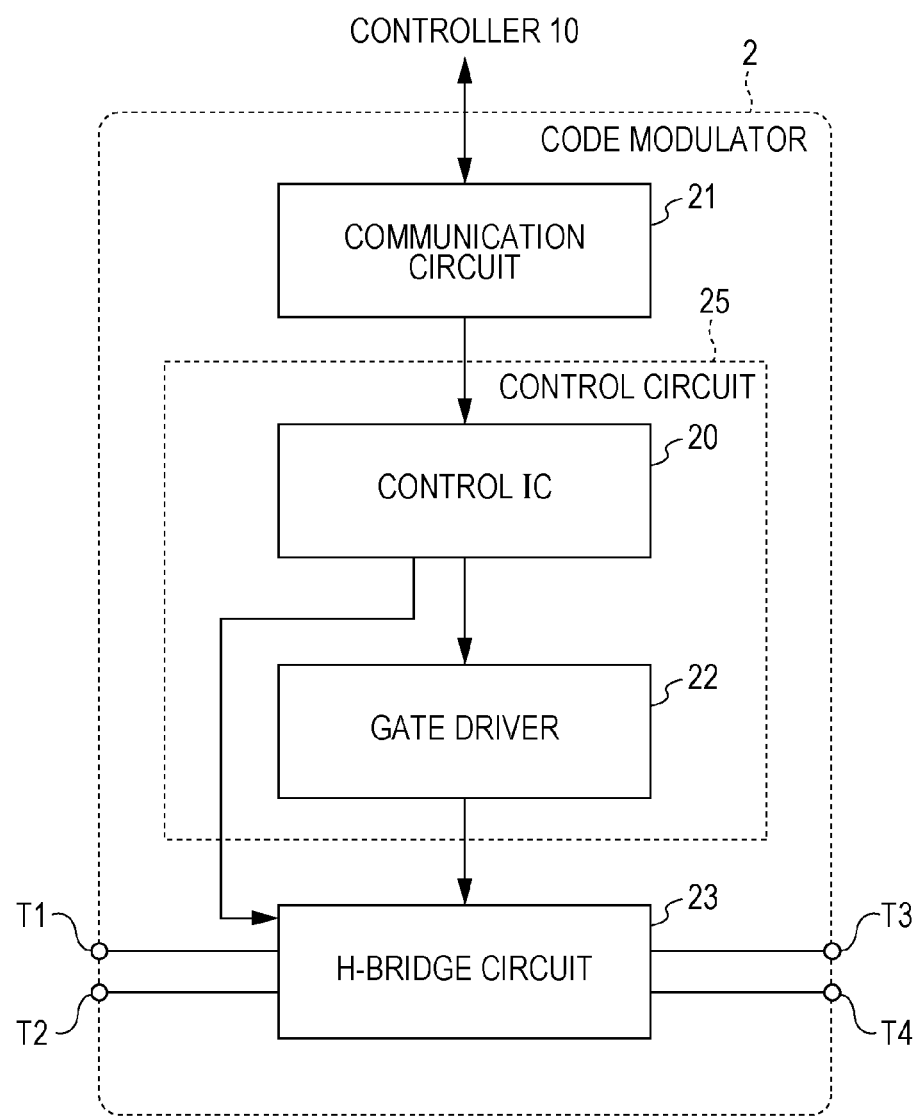
FIG. 5 is a block diagram illustrating an example configuration of a code modulator according to the first reference mode.

FIG. 5 illustrates an example configuration of the code modulator 2.

In FIG. 5, the code modulator 2 includes a communication circuit 21, a control circuit 25, and an H-bridge circuit 23. The control circuit 25 includes, for example, a control integrated circuit (IC) 20 and a gate driver 22.

The communication circuit 21 receives the instruction signals from the controller 10 and outputs the instruction signals to the control IC 20. The communication circuit 21 includes, for example, an antenna, a tuner circuit, and a wave detector.

The instruction signals include, for example, a synchronization signal and code information regarding the modulation code. Each synchronization signal may be, for example, a trigger signal for starting the modulation or may be a trigger signal for ending the modulation. Alternatively, the synchronization signal may be, for example, time information indicating the time at which the modulation is to be started or time information indicating the time at which the modulation is to be ended. The trigger signals and the time information are examples of timing information in the present disclosure.

The control IC 20 generates a modulation code on the basis of the instruction signals and causes the gate driver 22 to generate control signals according to the modulation code. The control IC 20 includes a processor. The control IC 20 is, for example, a microcomputer.

The gate driver 22 outputs the control signals to the H-bridge circuit 23 to thereby cause the H-bridge circuit 23 to execute a code modulation operation.

The code modulator 2 has input terminals T1 and T2 connected to the electric generator 1 and output terminals T3 and T4 connected to the transmission path 3. The input terminals T1 and T2 may function as an input port, and the output terminals T3 and T4 may function as an output port.

Figure 6:
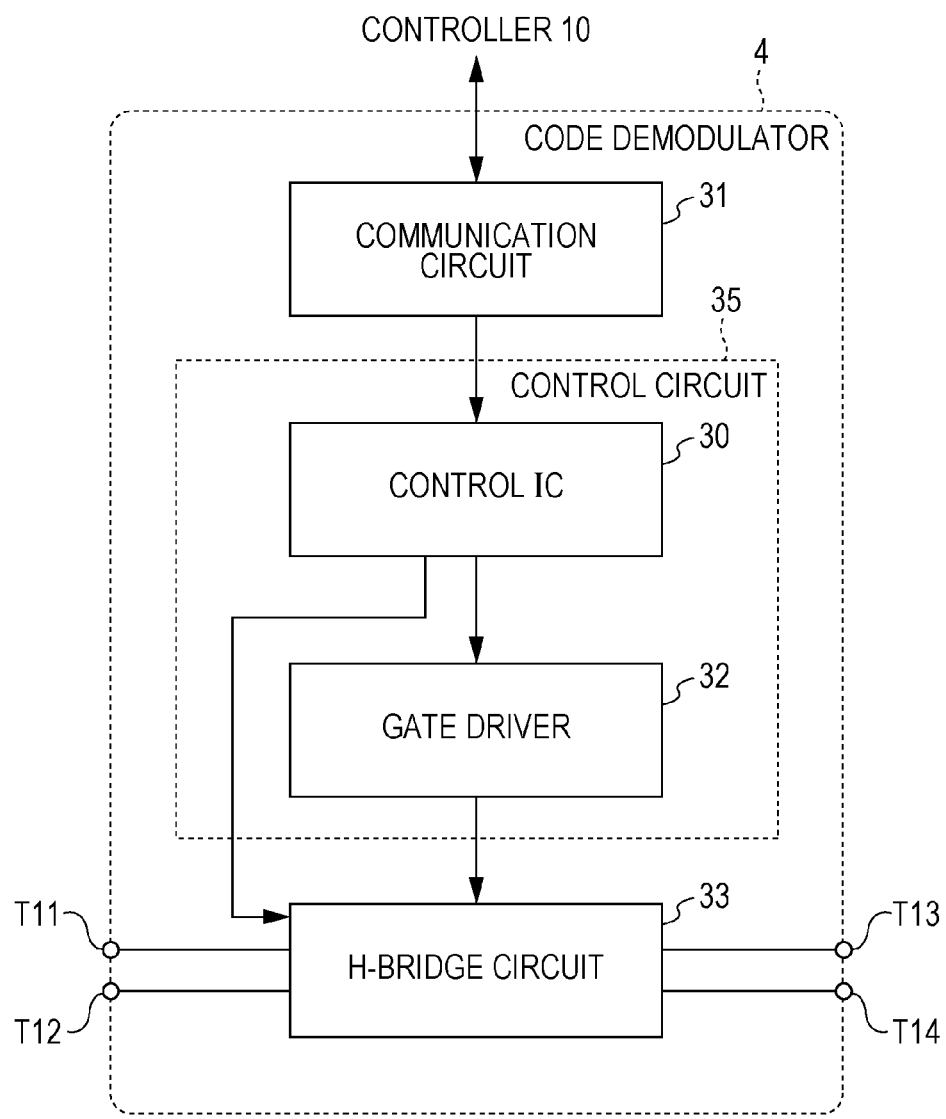
FIG. 6 is a block diagram illustrating an example configuration of a code demodulator according to the first reference mode.

FIG. 6 illustrates an example configuration of the code demodulator 4.

In FIG. 6, the code demodulator 4 includes a communication circuit 31, a control circuit 35, and an H-bridge circuit 33. The control circuit 35 includes, for example, a control IC 30 and a gate driver 32.

The communication circuit 31 receives the instruction signals from the controller 10 and outputs the instruction signals to the control IC 30. The communication circuit 31 includes, for example, an antenna, a tuner circuit, and a wave detector.

The instruction signals include, for example, a synchronization signal and code information regarding the demodulation code. The synchronization signal may be, for example, a trigger signal for starting the demodulation or a trigger signal for ending the demodulation. Alternatively, the synchronization signal may be, for example, time information indicating the time at which the demodulation is to be started or time information indicating the time at which the demodulation is to be ended. The trigger signals and the time information are examples of the timing information in the present disclosure.

The control IC 30 generates a demodulation code on the basis of the instruction signals and causes the gate driver 32 to generate control signals according to the demodulation code. The control IC 30 includes a processor and is, for example, a microcomputer.

The gate driver 32 outputs the control signals to the H-bridge circuit 33 to thereby cause the H-bridge circuit 33 to execute a code demodulation operation.

The code demodulator 4 has input terminals T11 and T12 connected to the transmission path 3 and output terminals T13 and T14 connected to the load 5. The input terminals T11 and T12 may function as an input port, and the output terminals T13 and T14 may function as an output port.

As illustrated in FIG. 1, the controller 10 transmits the control signals to the code demodulator 4 and the code modulator 2 through paths different from the transmission path 3. The controller 10, however, may transmit the control signals to the code modulator 2 and the code demodulator 4 through the transmission path 3. In this case, the control signals can be transmitted, for example, through multiplexing with the code-modulated power. For example, this reduces the number of communication paths from the controller 10 to the code modulator 2 and the code demodulator 4, thereby making it possible to reduce cost.

Figure 7:
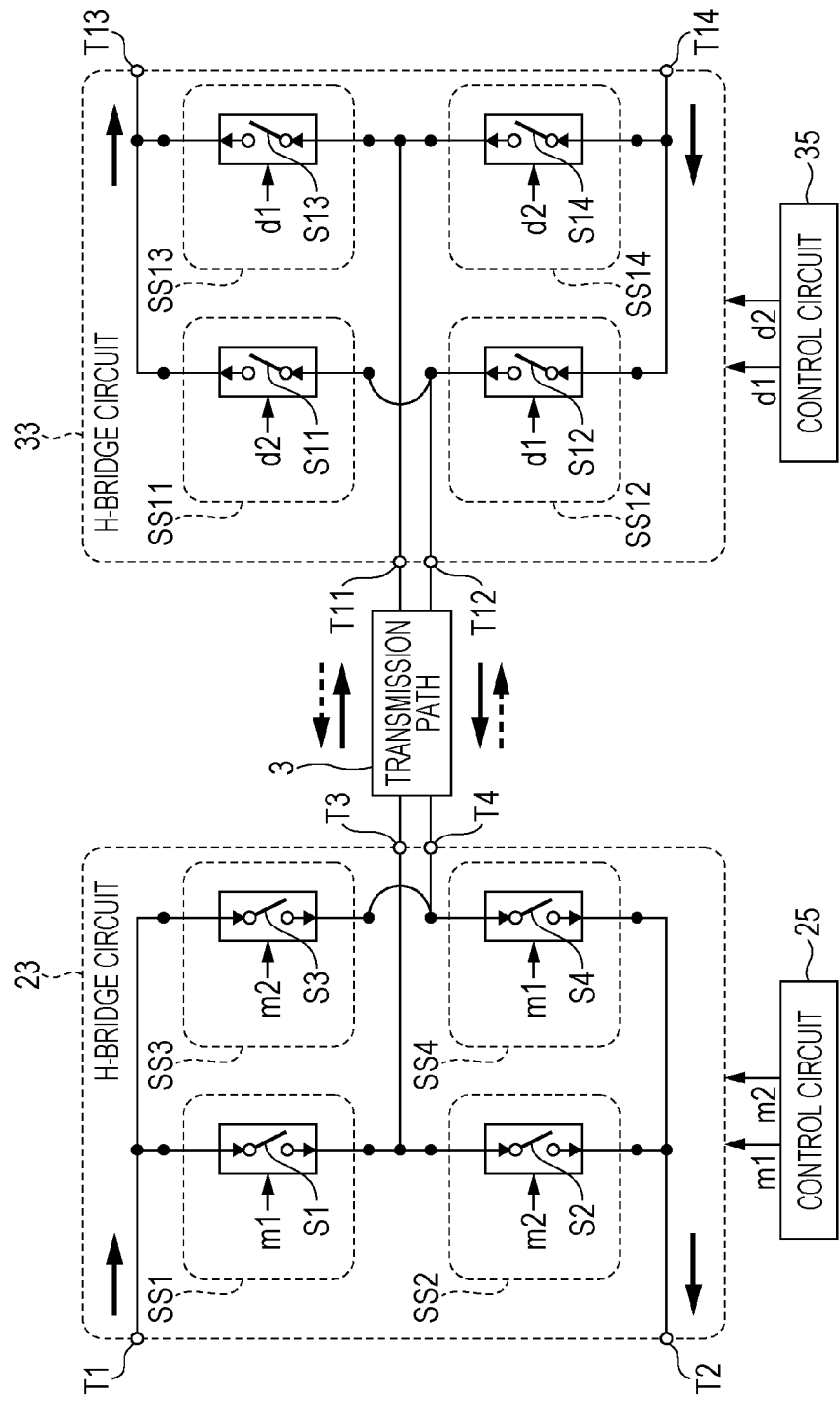
FIG. 7 is a schematic circuit diagram illustrating an example configuration of the code modulator, a transmission path, and the code demodulator according to the first reference mode.

FIG. 7 illustrates an example configuration of the control circuit 25 and the H-bridge circuit 23 in the code modulator 2 and an example configuration of the control circuit 35 and the H-bridge circuit 33 in the code demodulator 4.

In FIG. 7, the H-bridge circuit 23 includes four switch circuits SS1, SS2, SS3, and SS4 connected in a full-bridge configuration. For example, the switch circuits SS1, SS2, SS3, and SS4 include switches S1, S2, S3, and S4, respectively.

In FIG. 7, the H-bridge circuit 33 includes four switch circuits SS11, SS12, SS13, and SS14 connected in a full-bridge configuration. For example, the switch circuits SS11, SS12, SS13, and SS14 include switches S11, S12, S13, and S14, respectively.

Each of the switches S1 to S4 and S11 to S14 may be, for example, a bidirectional switch or a metal-oxide semiconductor (MOS) transistor.

The control circuit 25 generates predetermined code sequences m1 and m2. The control circuit 25 outputs the code sequence m1 to the switches S1 and S4 as control signals and outputs the code sequence m2 to the switches S2 and S3 as control signals.

For example, each of the switches S1 to S4 is in an ON state when a signal indicating "1" is input thereto, and each of the switches S1 to S4 is in an OFF state when a signal indicating "0" is input thereto. When the switch S1 is in the ON state, current flows from the terminal T1 to the terminal T3. When the switch S3 is in the ON state, current flows from the terminal T1 to the terminal T4. When the switch S2 is in the ON state, current flows from the terminal T3 to the terminal T2. When the switch S4 is in the ON state, current flows from the terminal T4 to the terminal T2.

The control circuit 35 generates predetermined code sequences d1 and d2. The control circuit 35 outputs the code sequence d1 to the switches S12 and S13 as control signals and outputs the code sequence d2 to the switches S11 and S14 as control signals.

For example, each of the switches S11 to S14 is in an ON state when a signal indicating "1" is input thereto, and each of the switches S11 to S14 is in an OFF state when a signal indicating "0" is input thereto. When the switch S11 is in the ON state, current flows from the terminal T12 to the terminal T13. When the switch S13 is in the ON state, current flows from the terminal T11 to the terminal T13. When the switch S12 is in the ON state, current flows from the terminal T14 to the terminal T12. When the switch S14 in the ON state, current flows from the terminal T14 to the terminal T11.

In FIG. 7, current that flows in the direction indicated by each solid-line arrow is regarded as positive current. In FIG. 7, the structure of the code modulator 2 and the structure of the code demodulator 4 are generally symmetrical to each other, but the directions in which the currents flow differ from each other.

[5. Operation]
[5-1. Control Signals]

Table 1 illustrates examples of code sequences of the control signals m1 and m2 input to the switches S1 to S4 in the code modulator 2 and examples of code sequences of the control signals d1 and d2 input to the switches S11 to S14 in the code demodulator 4.

TABLE 1

| CONTROL SIGNAL | CODE SEQUENCE |
| --- | --- |
| m1 | c1a = [1 0 1 1 1 0 0] |
| m2 | c1b = [0 1 0 0 0 1 1] |
| d1 | c1a = [1 0 1 1 1 0 0] |
| d2 | c1b = [0 1 0 0 0 1 1] |

In the examples, the code sequence of the control signals m1 and the code sequence of control signals d1 are the same code sequence c1a, and the code sequence of the control signals m2 and the code sequence of the control signals d2 are the same code sequence c1b. The code sequence c1b is a sequence obtained by inverting all bits of the code sequence c1a.

[5-2. Operation of Code Modulator]

A description will be given of the operation of the code modulator 2.

When the control signal m1 indicates "1", and the control signal m2 indicates "0", the switches S1 and S4 are in the ON state, and the switches S2 and S3 in the OFF state. At this point in time, a positive generated current I1 input to the code modulator 2 flows in the direction indicated by the solid-line arrow in FIG. 7, so that a positive modulated current I2 flows to the terminals T3 and T4. That is, the generated current I1 is code-modulated with "1".

On the other hand, when the control signal m1 indicates "0", and the control signal m2 indicates "1", the switches S1 and S4 are in the OFF state, and the switches S2 and S3 are in the ON state. At this point in time, a positive generated current I1 input to the code modulator 2 flows in the direction indicated by the dotted-line arrow in FIG. 7, so that a negative modulated current I2 flows to the terminals T3 and T4. That is, the generated current I1 is code-modulated with "−1".

The series of switching operations based on the control signals m1 and m2 illustrated in Table 1 corresponds to an operation for code-modulating the generated current I1 with a modulation code Ma given by:

$$Ma=[1\text{−}1\ 1\ 1\ 1\text{−}1\text{−}1] \quad (4)$$

Thus, the code modulator 2 code-modulates the generated current I1 with the modulation code Ma and outputs an AC modulated current I2 to the transmission path 3 via the terminals T3 and T4.

[5-3. Operation of Code Demodulator]

A description will be given of the operation of the code demodulator 4.

The control signals d1 and d2 are synchronized with the control signals m1 and m2. Thus, when a positive modulated current I2 is input to the code demodulator 4, the control signal d1 indicates "1", and the control signal d2 indicates "0". At this point in time, the switches S13 and S12 are in the ON state, and the switches S11 and S14 are in the OFF state. Thus, the positive modulated current I2 flows in the direction indicated by the solid-line arrow in FIG. 7, so that a positive demodulated current I3 flows to the terminals T13 and T14. That is, the modulated current I2 is code-demodulated with "1".

On the other hand, when a negative modulated current I2 is input to the code demodulator 4, the control signal d1 indicates "0", and the control signal d2 indicates "1". At this point in time, the switches S11 and S14 are in the ON state, and the switches S12 and S13 are in the OFF state. Thus, the negative modulated current I2 flows in the direction indicated by the solid-line arrow in FIG. 7, so that a positive demodulated current I3 flows to the terminals T13 and T14. That is, the modulated current I2 is code-demodulated with "−1".

The series of switching operations based on the control signals d1 and d2 in Table 1 corresponds to an operation for code-demodulating the modulated current I2 with a demodulation code Da given by:

$$Da=[1\text{−}1\ 1\ 1\ 1\text{−}1\text{−}1] \quad (5)$$

Thus, the code demodulator 4 code-demodulates the modulated current I2 with the demodulation code Da and outputs the positive demodulated current I3 via the terminals T13 and T14.

[5-4. Other Examples of Control Signals]

Table 2 illustrates other examples of the code sequences of the control signals m1, m2, d1, and d2.

TABLE 2

| CONTROL SIGNAL | CODE SEQUENCE |
| --- | --- |
| m1 | [c1a c1b] = [1 0 1 1 1 0 0 0 1 0 0 0 1 1] |
| m2 | [c1b c1a] = [0 1 0 0 0 1 1 1 0 1 1 1 0 0] |
| d1 | [c1a c1b] = [1 0 1 1 1 0 0 0 1 0 0 0 1 1] |
| d2 | [c1b c1a] = [0 1 0 0 0 1 1 1 0 1 1 1 0 0] |

In each of the code sequences of the control signals m1 and m2 illustrated in Table 1, the number of 1s is not equal to the number of 0s. Thus, in the code sequence of the modulation code Ma, the number of 1s and the number of −1s are not equal to each other. In such a case, the average of the modulated current I2 does not become 0, and the modulated current I2 is an AC including a small amount of DC components.

On the other hand, in Table 2, the control signals m1 and d1 each have a code sequence [c1a c1b] in which the code sequence c1a and the code sequence c1b are coupled in tandem, and the control signals m2 and d2 each have a code sequence [c1b c1a] in which the code sequence c1b and the code sequence c1a are coupled in tandem. Since the code sequence c1b is a sequence in which all bits of the code sequence c1a are inverted, as described above, the number of 1s and the number of 0s in a code sequence in which the code sequences c1a and c1b are coupled are equal to each other. Thus, the modulated current I2 is an AC that does not include DC components, thus further enhancing the transmission efficiency. The control signals m1 and m2 illustrated in Table 2 correspond to the modulation code M1 described above, and the control signals d1 and d2 correspond to the demodulation code D1 described above.

Second Reference Mode

A power transmission system according to a second reference mode is substantially the same as the power transmission system 100 described above in the first reference mode, except that the generated power is AC power. The following description will be given of the second reference mode, particularly, points that are different from the first reference mode.

[1. Code Modulation and Demodulation of AC Power]

Figure 8A:
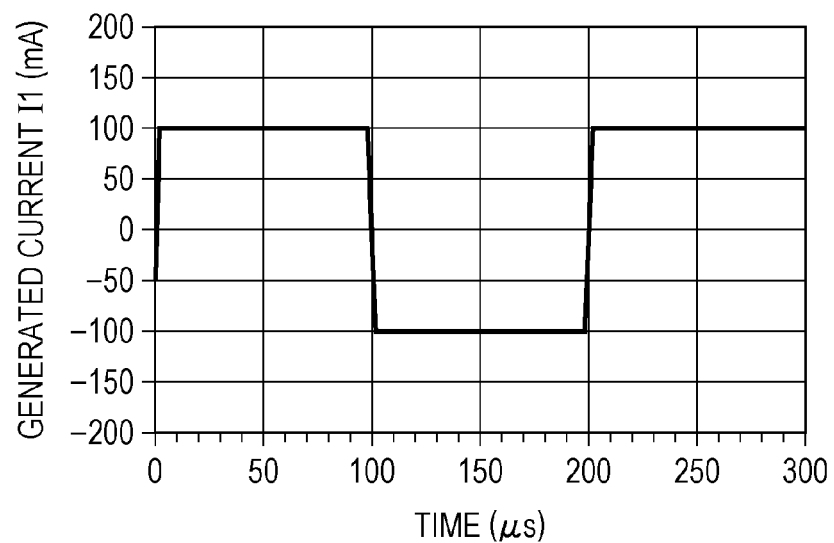
FIG. 8A is a graph illustrating one example of the waveform of a generated current according to a second reference mode.
Figure 8B:
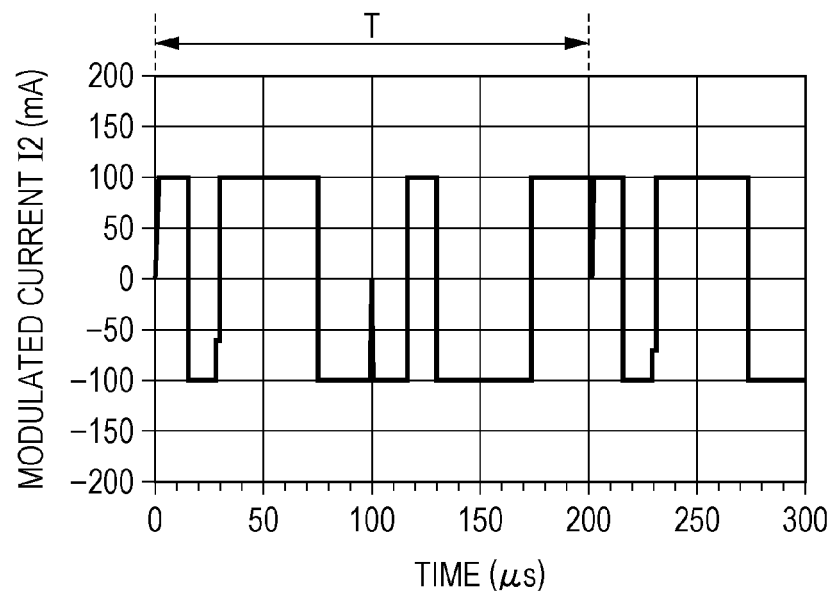
FIG. 8B is a graph illustrating one example of the waveform of a modulated current according to the second reference mode.
Figure 8C:
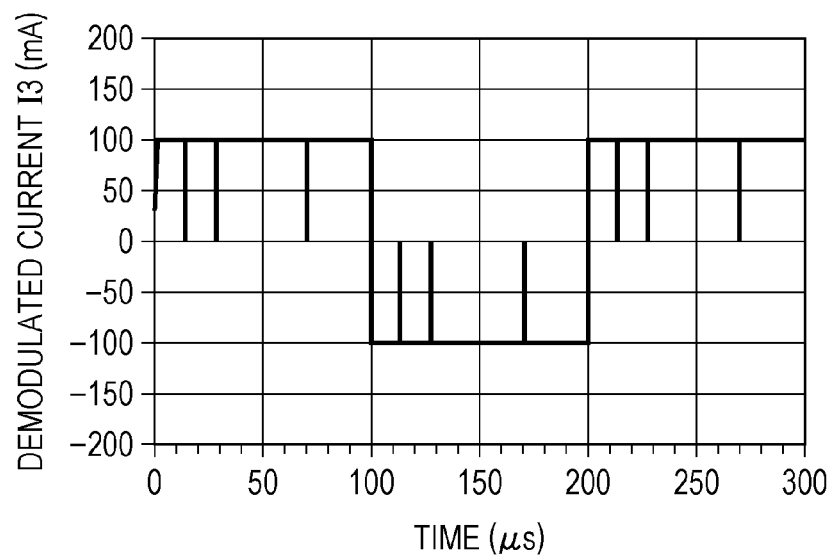
FIG. 8C is a graph illustrating one example of the waveform of a demodulated current according to the second reference mode.

FIGS. 8A to 8C illustrate examples of the waveforms of a generated current I1, a modulated current I2, and a demodulated current I3, respectively.

The generated current I1 illustrated in FIG. 8A was an AC having a rectangular waveform with a frequency of 5 kHz. The modulated current I2 illustrated in FIG. 8B was obtained by multiplying the generated current I1 by the modulation code M1. The modulated current I2 illustrated in FIG. 8B was an AC. The demodulated current I3 illustrated in FIG. 8C was obtained by multiplying the modulated current I2 by the demodulation code D1. The modulation code M1 and the demodulation code D1 were the same as those described in the first reference mode. As illustrated in FIG. 8C, an AC equivalent to the generated current I1 was restored as the demodulated current I3 through the code modulation and the code demodulation.

Accordingly, even when the generated power is AC power, the power can be transmitted with high transmission efficiency, as in the case in which the generated power is DC power.

[2. Code Modulator and Code Demodulator]

Figure 9:
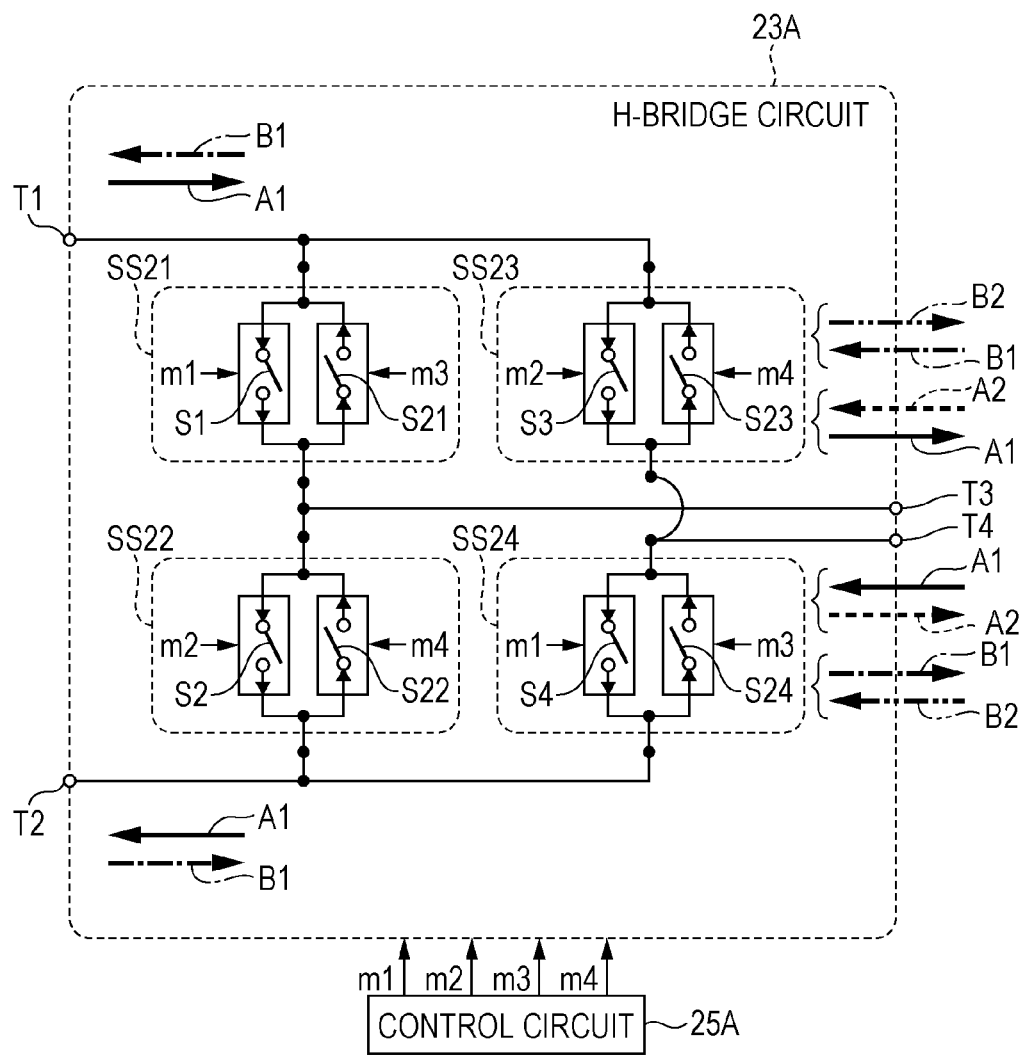
FIG. 9 is a schematic circuit diagram illustrating an example configuration of a code modulator according to the second reference mode.

FIG. 9 illustrates an example configuration of a control circuit 25A and an H-bridge circuit 23A in the code modulator 2 according to the second reference mode. The circuit illustrated in FIG. 9 differs from the circuit illustrated in FIG. 7 in the following points.

(1) The switch circuits SS1 to SS4 illustrated in FIG. 7 are replaced with bidirectional switch circuits SS21 to SS24.

(2) The control circuit 25 illustrated in FIG. 7 is replaced with the control circuit 25A. The control circuit 25A outputs code sequences m1 to m4 to the H-bridge circuit 23A as control signals.

The switch circuit SS21 includes, in addition to a switch S1 as illustrated in FIG. 7, a switch S21 connected in a direction opposite to and in parallel with the switch S1. The switch S21 is turned on or off in response to the control signal m3. The switch circuit SS22 includes, in addition to a switch S2 as illustrated in FIG. 7, a switch S22 connected in a direction opposite to and in parallel with the switch S2. The switch S22 is turned on or off in response to the control signal m4. The switch circuit SS23 includes, in addition to a switch S3 as illustrated in FIG. 7, a switch S23 connected in a direction opposite to and in parallel with the switch S3. The switch S23 is turned on or off in response to the control signal m4. The switch circuit SS24 includes, in addition to a switch S4 as illustrated in FIG. 7, a switch S24 connected in a direction opposite to and in parallel with the switch S4. The switch S24 is turned on or off in response to the control signal m3.

The switches S21 to S24 are, for example, MOS transistors.

Figure 10:
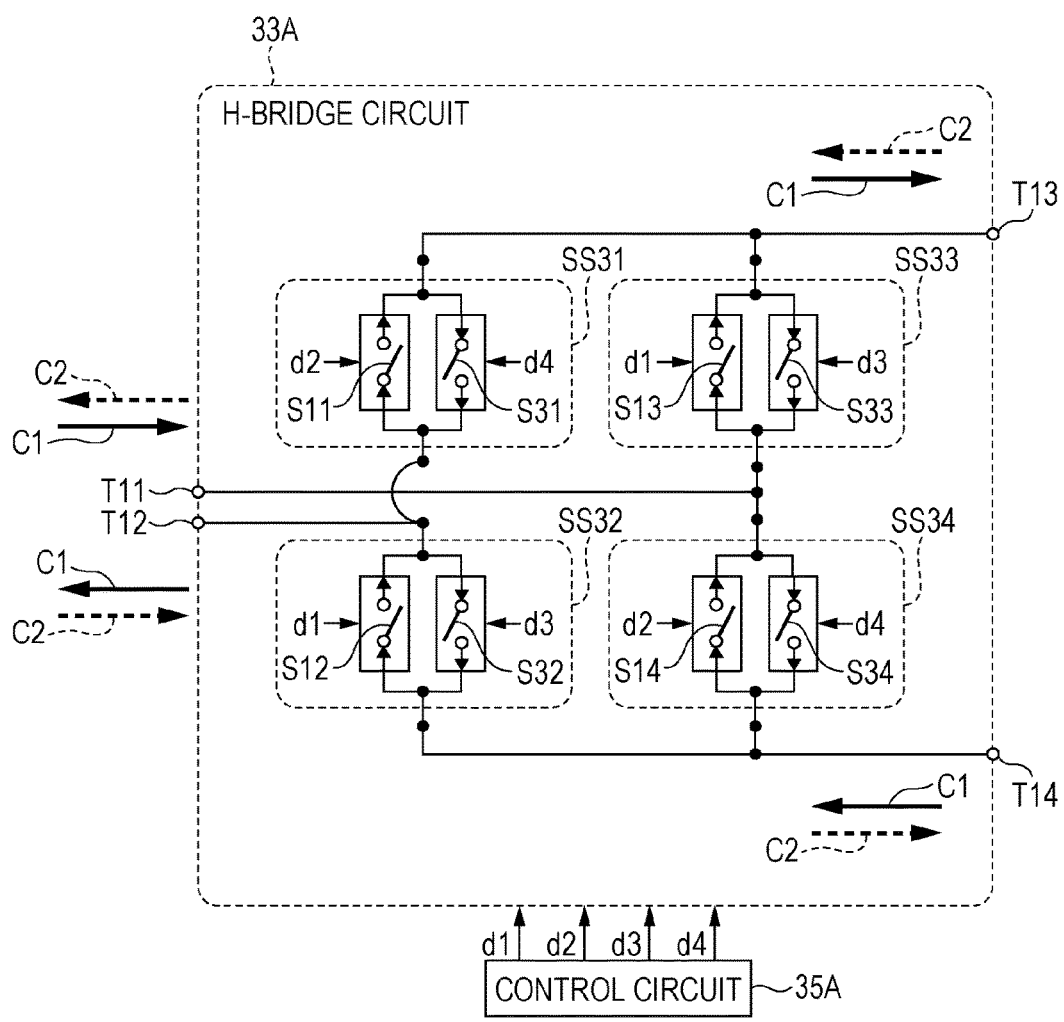
FIG. 10 is a schematic circuit diagram illustrating an example configuration of a code demodulator according to the second reference mode.

FIG. 10 illustrates an example configuration of a control circuit 35A and an H-bridge circuit 33A in the code demodulator 4 according to the second reference mode. The circuit illustrated in FIG. 10 differs from the circuit illustrated in FIG. 7 in the following points.

(1) The switch circuits SS11 to SS14 illustrated in FIG. 7 are replaced with bidirectional switch circuits SS31 to SS34.

(2) The control circuit 35 illustrated in FIG. 7 is replaced with the control circuit 35A. The control circuit 35A outputs code sequences d1 to d4 to the H-bridge circuit 33A as control signals.

The switch circuit SS31 includes, in addition to a switch S11 as illustrated in FIG. 7, a switch S31 connected in a direction opposite to and in parallel with the switch S11. The switch S31 is turned on or off in response to the control signal m4. The switch circuit SS32 includes, in addition to a switch S12 as illustrated in FIG. 7, a switch S32 connected in a direction opposite to and in parallel with the switch S12. The switch S32 is turned on or off in response to the control signal d3. The switch circuit SS33 includes, in addition to a switch S13 as illustrated in FIG. 7, a switch S33 connected in a direction opposite to and in parallel with the switch S13. The switch S33 is turned on or off in response to the control signal d3. The switch circuit SS34 includes, in addition to a switch S14 as illustrated in FIG. 7, a switch S34 connected in a direction opposite to and in parallel with the switch S14. The switch S34 is turned on or off in response to the control signal d4.

The switches S31 to S34 are, for example, MOS transistors.

[3. Operation]
[3-1. Control Signals]

Table 3 illustrates examples of the code sequences of the control signals m1 to m4 input to the switches S1 to S4 and S21 to S24 in the code modulator 2 and examples of the code sequences of the control signals d1 to d4 input to the switches S11 to S14 and S31 to S34 in the code demodulator 4.

TABLE 3

| CONTROL SIGNAL | CODE SEQUENCE |
|---|---|
| m1 | [c1a c0] = [1 0 1 1 1 0 0 0 0 0 0 0 0 0] |
| m2 | [c1b c0] = [0 1 0 0 0 1 1 0 0 0 0 0 0 0] |
| m3 | [c0 c1a] = [0 0 0 0 0 0 0 1 0 1 1 1 0 0] |
| m4 | [c0 c1b] = [0 0 0 0 0 0 0 0 1 0 0 0 1 1] |
| d1 | [c1a c0] = [1 0 1 1 1 0 0 0 0 0 0 0 0 0] |
| d2 | [c1b c0] = [0 1 0 0 0 1 1 0 0 0 0 0 0 0] |
| d3 | [c0 c1a] = [0 0 0 0 0 0 0 1 0 1 1 1 0 0] |
| d4 | [c0 c1b] = [0 0 0 0 0 0 0 0 1 0 0 0 1 1] |

In this example, the code sequences of the control signals m1, m2, m3, and m4 are the same as the code sequences of the control signals d1, d2, d3, and d4, respectively. In Table 3, the code sequence c1b is a code sequence obtained by inverting all bits of the code sequence c1a, and a code sequence c0 is a code sequence in which all bits are 0s. The time span of the code sequences c1a, c1b, and c0 match the half cycle of the AC generated current I1.

[3-2. Operation of Code Modulator]

A description will be given of the operation of the code modulator 2. Now, suppose a case in which the generated current I1 becomes positive in a first half cycle (i.e., a front half of one cycle) and becomes negative in a second half cycle (i.e., a last half of one cycle).

[3-2-1. Operation of Code Modulator in First Half Cycle]

In the first half cycle, the switches S1 to S4 are turned on or off in accordance with the control signals m1 and m2, and the switches S21 to S24 are maintained in the OFF state.

When the control signal m1 indicates "1", and the control signal m2 indicates "0", the switches S1 and S4 are in the ON state, and the switches S2 and S3 are in the OFF state. At this point in time, a positive generated current I1 flows in the direction indicated by arrow A1 in FIG. 9, so that a positive modulated current I2 flows to the terminals T3 and T4. That is, the generated current I1 is code-modulated with "1".

On the other hand, when the control signal m1 indicates "0", and the control signal m2 indicates "1", the switches S1 and S4 are in the OFF state, and the switches S2 and S3 are in the ON state. At this point in time, the positive generated current I1 flows in the direction indicated by arrow A2 in FIG. 9, so that a negative modulated current I2 flows to the terminals T3 and T4. That is, the generated current I1 is code-modulated with "−1".

Thus, in the first half cycle, the code modulator 2 outputs an AC modulated current I2 to the transmission path 3 via the terminals T3 and T4.

[3-2-2. Operation of Code Modulator in Second Half Cycle]

In the second half cycle, the switches S1 to S4 are maintained in the OFF state, and the switches S21 to S24 are turned on or off in accordance with the control signals m3 and m4.

When the control signal m3 indicates "1", and the control signal m4 indicates "0", the switches S21 and S24 are in the ON state, and the switches S22 and S24 are in the OFF state. At this point in time, a negative generated current I1 input to the code modulator 2 flows in the direction indicated by arrow B1 in FIG. 9, so that a negative modulated current I2 flows to the terminals T3 and T4. That is, the generated current I1 is code-modulated with "1".

On the other hand, when the control signal m3 indicates "0", and the control signal m4 indicates "1", the switches S21 and S24 are in the OFF state, and the switches S22 and S23 are in the ON state. At this point in time, a negative generated current I1 input to the code modulator 2 flows in the direction indicated by arrow B2 in FIG. 9, so that a positive modulated current I2 flows to the terminals T3 and T4. That is, the generated current I1 is code-modulated with "−1".

Accordingly, in the second half cycle, the code modulator 2 also outputs an AC modulated current I2 to the transmission path 3 via the terminals T3 and T4.

[3-2-3. Supplement]

The series of switching operations based on the control signals m1 to m4 illustrated in Table 2 corresponds to an operation for code-modulating the generated current I1 with a modulation code Mb given by:

$$Mb=[1\text{-}1\ 1\ 1\ 1\text{-}1\text{-}1\ 1\text{-}1\ 1\ 1\ 1\text{-}1\text{-}1] \quad (6)$$

In the modulation code Mb, the number of 1s is larger than the number of −1s. However, the average of the modulated current I2 can become 0. This is because the generated current I1 is positive in the first half cycle and is negative in the second half cycle, and a partial sequence of the modulation code Mb in the first half cycle and a partial sequence of the modulation code Mb in the second half cycle are the same.

[3-3. Operation of Code Demodulator]

A description will be given of the operation of the code demodulator 4.

[3-3-1. Operation of Code Demodulator in First Half Cycle]

In the first half cycle, the switches S11 to S14 are turned on or off in accordance with the control signals d1 and d2, and the switches S31 to S34 are maintained in the OFF state.

When a positive modulated current I2 is input to the code demodulator 4 in the first half cycle, the control signal d1 indicates "1", and the control signal d2 indicates "0". At this point in time, the switches S12 and S13 are in the ON state, and the switches S11 and S14 are in the OFF state. Thus, the positive modulated current I2 flows in the direction indicated by arrow C1 in FIG. 10, and a positive demodulated current I3 flows to the terminals T13 and T14. That is, the modulated current I2 is code-demodulated with "1".

In the first half cycle, when the negative modulated current I2 is input to the code demodulator 4, the control signal d1 indicates "0", and the control signal d2 indicates "1". At this point in time, the switches S12 and S13 are in the OFF state, and the switches S11 and S14 are in the ON state. Thus, a negative modulated current I2 flows in the direction indicated by arrow C1 in FIG. 10, and a positive demodulated current I3 flows to the terminals T13 and T14. That is, the modulated current I2 is code-demodulated with "−1".

Thus, the code demodulator 4 outputs the positive demodulated current I3 via the terminals T13 and T14 in the first half cycle.

[3-3-2. Operation of Code Demodulator in Second Half Cycle]

In the second half cycle, the switches S11 to S14 are maintained in the OFF state, and the switches S31 to S34 are turned on or off in accordance with the control signals d3 and d4.

In the second half cycle, when a positive modulated current I2 is input to the code demodulator 4, the control signal d3 indicates "1", and the control signal d4 indicates "0". At this point in time, the switches S32 and S33 are in the ON state, and the switches S31 and S34 are in the OFF state. Thus, the positive modulated current I2 flows in the direction indicated by arrow C2 in FIG. 10, and a negative demodulated current I3 flows to the terminals T13 and T14. That is, the modulated current I2 is code-demodulated with "−1".

In the second half cycle, when the negative modulated current I2 is input to the code demodulator 4, the control signal d3 indicates "0", and the control signal d4 indicates "1". At this point in time, the switches S32 and S33 are in the OFF state, and the switches S31 and S34 are in the ON state. Thus, a negative modulated current I2 flows in the direction indicated by arrow C2 in FIG. 10, and a negative demodulated current I3 flows to the terminals T13 and T14. That is, the modulated current I2 is code-demodulated with "1".

Accordingly, the code demodulator 4 outputs the negative demodulated current I3 via the terminals T13 and T14 in the second half cycle. In other words, the code demodulator 4 generates, as the demodulated current I3, an AC that is positive in the first half cycle and is negative in the second half cycle, and the waveform of the AC generally matches the waveform of the generated current I1.

[3-3-3. Supplement]

The series of switching operations based on the control signals d1 to d4 illustrated in Table 2 corresponds to an operation of code-demodulating the modulated current I2 with a demodulation code Db:

$$Db=[1\text{-}1\ 1\ 1\ 1\text{-}1\text{-}1\ 1\text{-}1\ 1\ 1\ 1\text{-}1\text{-}1] \quad (7)$$

[4. Modification of Operation]

Table 4 illustrates other examples of the code sequences of the control signals m1 to m4 input to the switches S1 to S4 and S21 to S24 in the code modulator 2 and other examples of the code sequences of the control signals d1 to d4 input to switches S11 to S14 and S31 to S34 in the code demodulator.

TABLE 4

| CONTROL SIGNAL | CODE SEQUENCE |
|---|---|
| m1 | [c1a c1b] = [1 0 1 1 1 0 0 0 1 0 0 0 1 1] |
| m2 | [c1b c1a] = [0 1 0 0 0 1 1 1 0 1 1 1 0 0] |
| m3 | [c0 c0] = [0 0 0 0 0 0 0 0 0 0 0 0 0 0] |
| m4 | [c0 c0] = [0 0 0 0 0 0 0 0 0 0 0 0 0 0] |
| d1 | [c1a c1b] = [1 0 1 1 1 0 0 0 1 0 0 0 1 1] |
| d2 | [c1b c1a] = [0 1 0 0 0 1 1 1 0 1 1 1 0 0] |
| d3 | [c0 c0] = [0 0 0 0 0 0 0 0 0 0 0 0 0 0] |
| d4 | [c0 c0] = [0 0 0 0 0 0 0 0 0 0 0 0 0 0] |

The control signals m3, m4, d3, and d4 illustrated in Table 4 maintain the switches S21 to S24 and S31 to S34 in the OFF state. Thus, the H-bridge circuit 23A illustrated in FIG. 9 and the H-bridge circuit 33A illustrated in FIG. 10 are the substantially the same as the H-bridge circuit 23 and the H-bridge circuit 33, respectively, illustrated in FIG. 7.

In addition, the control signals m1, m2, d1, and d2 illustrated in Table 4 are the same as the control signals m1, m2, d1, and d2 illustrated in Table 2. Thus, the code modulator 2 and the code demodulator 4 in this reference mode can realize DC-power modulation and demodulation like those described above in the first reference mode.

Accordingly, when the control signals are changed, the code modulator and the code demodulator according to this reference mode can deal with both DC-power modulation and demodulation and AC-power modulation and demodulation.

When the electric generator 1 generates DC power, it may be, for example, a photovoltaic generator. When the electric generator 1 generates AC power, it may be, for example, an electric generator utilizing turbine rotation. Examples of such an electric generator include a fossil-fuel power station, a hydropower station, a wind power generator, a nuclear power station, and a tidal power station.

[5. Modifications of Code Modulator and Code Demodulator]

Figure 11:
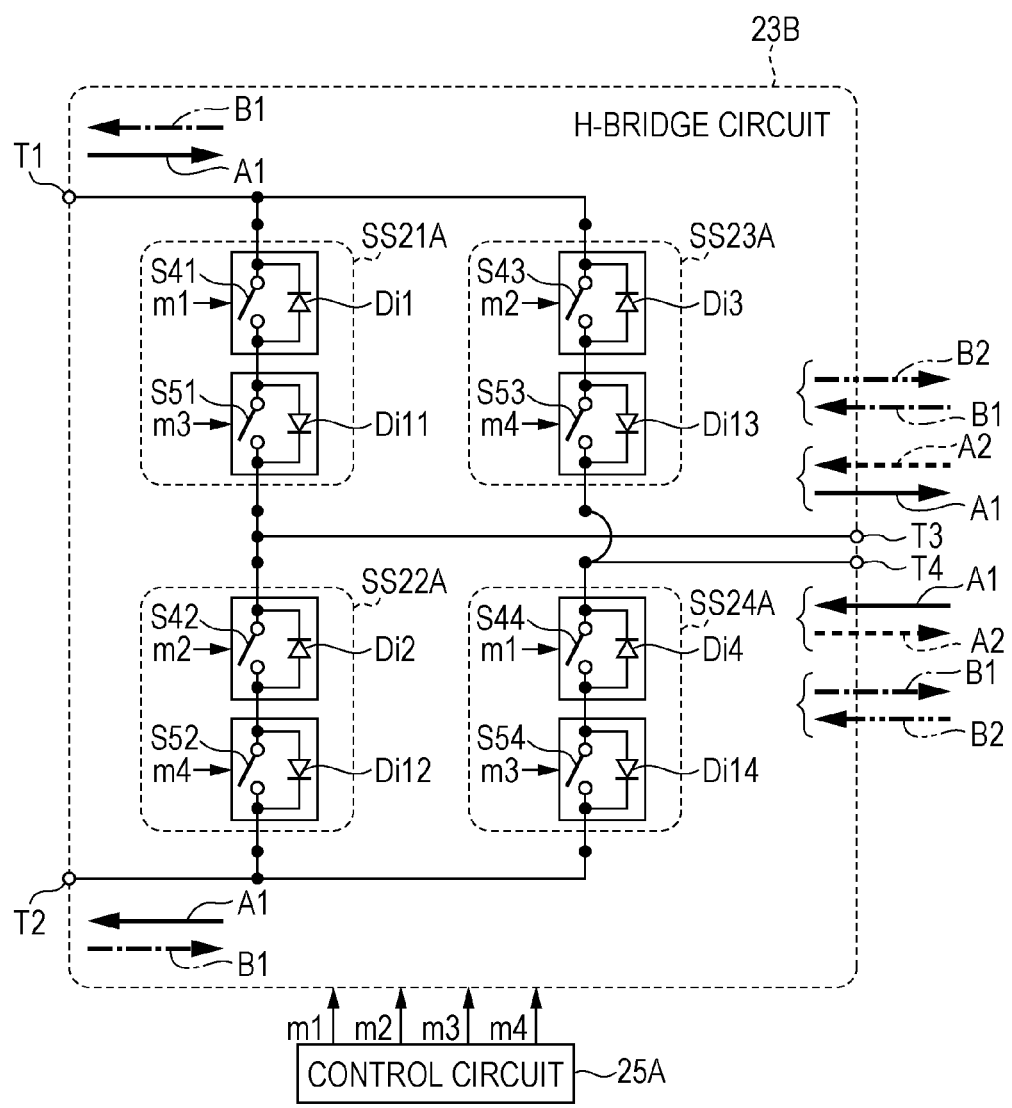
FIG. 11 is a schematic circuit diagram illustrating the configuration of a code modulator according to a modification of the second reference mode.

FIG. 11 illustrates a modification of an H-bridge circuit 23B in the code modulator 2 according to the second reference mode. The H-bridge circuit 23B illustrated in FIG. 11 includes bidirectional switch circuits SS21A to SS24A in place of the bidirectional switch circuits SS21 to SS24 illustrated in FIG. 9.

The bidirectional switch circuit SS21A includes switches S41 and S51 and diodes Di1 and Di11. The switches S41 and S51 are connected in series with each other. The diode Di1 is connected in parallel with the switch S41. The diode Di11 is connected in parallel with the switch S51. The diode Di1 passes current from a terminal T3 to a terminal T1. The diode Di11 passes current from the terminal T1 to the terminal T3. Since the bidirectional switch circuits SS22A to 5524A have structures that are the same as or similar to that of the bidirectional switch circuit SS21A, descriptions thereof are not given hereinafter.

The control circuit 25A outputs a control signal m1 to the switches S41 and S44, outputs a control signal m2 to the switches S42 and S43, outputs a control signal m3 to the switches S51 and S54, and outputs a control signal m4 to the switches S52 and S53. The control signals m1 to m4 ma be, for example, the control signals illustrated in Table 3.

Figure 12:
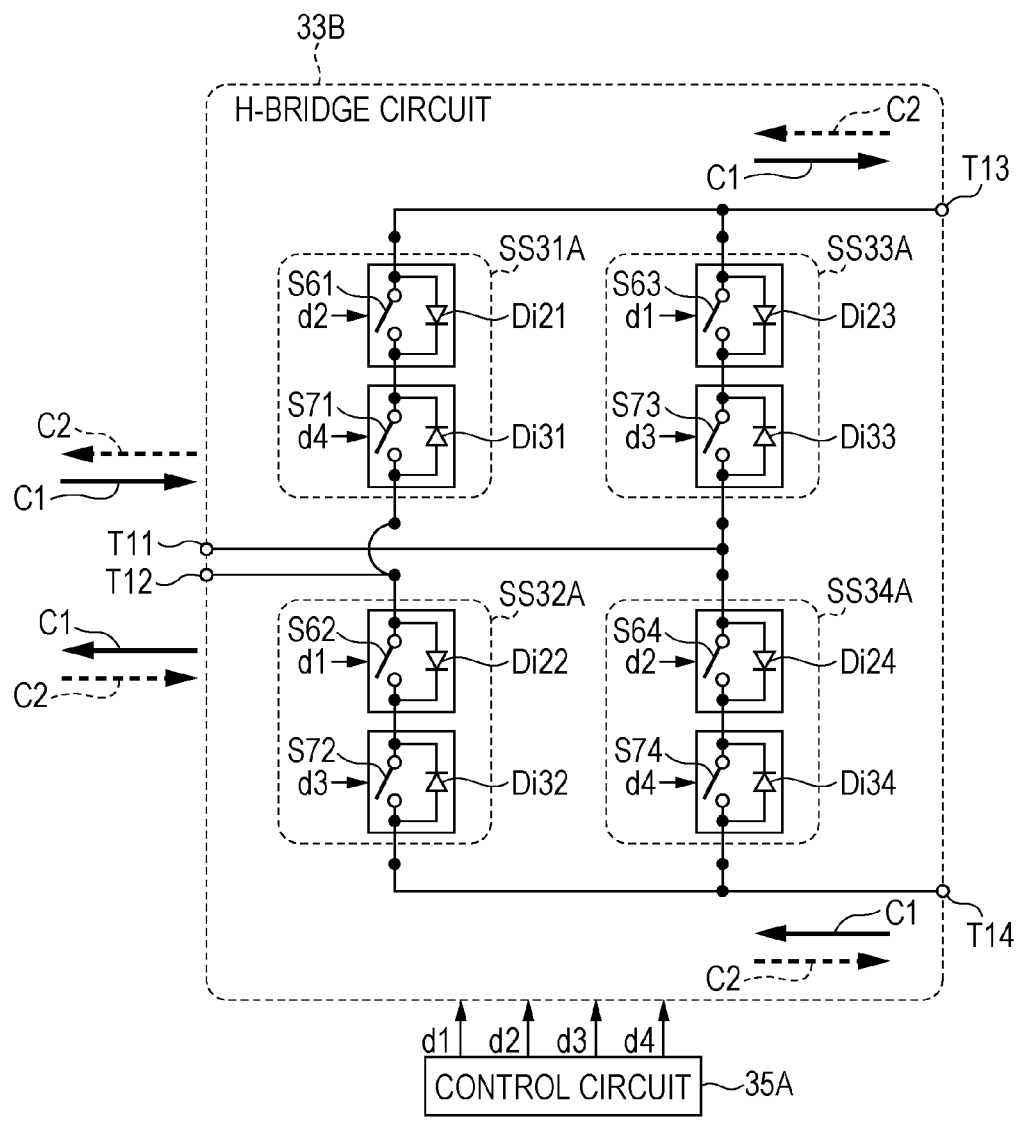
FIG. 12 is a schematic circuit diagram illustrating the configuration of a code demodulator according to a modification of the second reference mode.

FIG. 12 illustrates a modification of an H-bridge circuit 33B in the code demodulator 4 according to the second reference mode. The H-bridge circuit 33B illustrated in FIG. 12 includes bidirectional switch circuits SS31A to SS34A in place of the bidirectional switch circuits SS31 to SS34 illustrated in FIG. 10.

The bidirectional switch circuit SS31A includes switches S61 and S71 and diodes Di21 and Di31. The switches S61 and S71 are connected in series with each other. The diode Di21 is connected in parallel with the switch S61. The diode Di31 is connected in parallel with the switch S71. The diode Di21 passes current from a terminal T13 to a terminal T12. The diode Di31 passes current from the terminal T12 to the terminal T13. Since bidirectional switch circuits SS32A to 5534A have structures that are same as or similar to that of the bidirectional switch circuit SS31A, descriptions thereof are not given hereinafter.

The control circuit 35A outputs a control signal d1 to switches S62 and S63, outputs a control signal d2 to the switches S61 and S64, outputs a control signal d3 to switches S72 and S73, and outputs a control signal d4 to the switches S71 and S74. The control signals d1 to d4 may be, for example, those illustrated in Table 3.

The switches S41 to S44, S51 to S54, S61 to S64, and S71 to S74 may be, for example, MOS transistors. In this case, the diodes Di1 to Di4, Di11 to Di14, Di21 to Di24, and Di31 to Di34 may be, for example, body diodes of the MOS transistors. This makes it possible to miniaturize the bidirectional switches SS21A to SS24A and SS31A to SS34A.

First Embodiment

The following description will be given of a first embodiment, particularly, points that are different from the reference modes.

[1. Power Transmission System]

Figure 13:
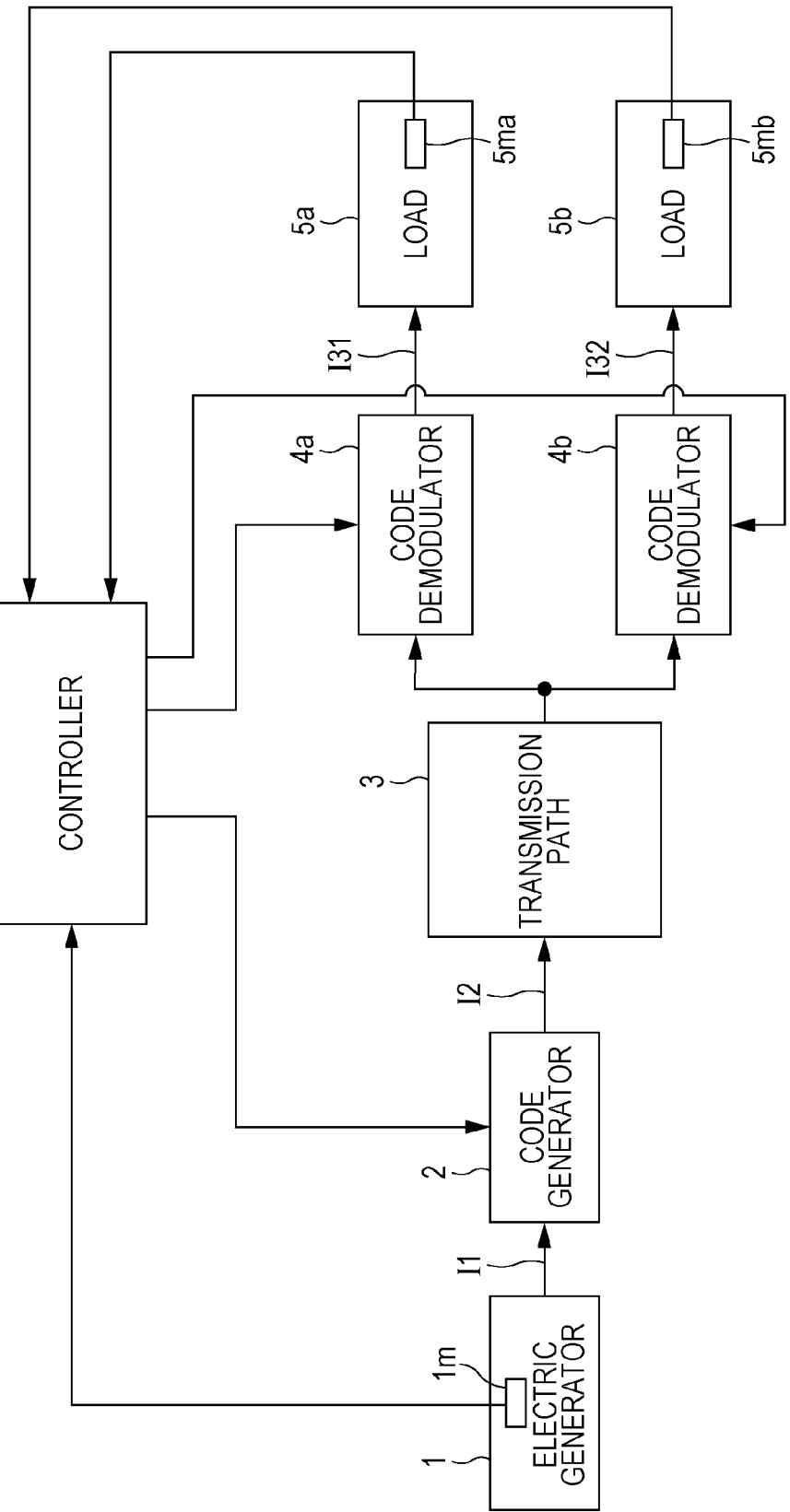
FIG. 13 is a block diagram illustrating an example configuration of a power transmission system according to a first embodiment.

FIG. 13 illustrates an example configuration of a power transmission system 100A according to the first embodiment.

The power transmission system 100A differs from the power transmission system 100 in the following following points.

(1) The code demodulator 4 is replaced with code demodulators 4a and 4b.
(2) The load 5 is replaced with loads 5a and 5b, which have power measuring instruments 5ma and 5mb, respectively.
(3) The controller 10 is replaced with a controller 10A, which causes the code modulator 2 to code-modulate generated power with a modulation code and causes the code demodulators 4a and 4b to convert the code-modulated power with a conversion code based on the modulation code.

The conversion code is, for example, a code generated from a demodulation code corresponding to the modulation code.

The controller 10A may generate the conversion code by using the modulation code and/or the demodulation code and then transmit code information regarding the generated conversion code to the code demodulators 4a and 4b. Alternatively, the controller 10A may transmit, to the code demodulators 4a and 4b, code information regarding the modulation code and/or the demodulation code and an instruction for modifying at least a portion of the code sequence of the demodulation code. In the latter case, the conversion code is generated by the code demodulators 4a and 4b.

The controller 10A includes, for example, a memory in which a program for generating instruction signals is recorded, a processor for executing the program, and a communication circuit for transmitting the instruction signals. The controller 10A may be, for example, a microcomputer.

Although the blocks denoted by reference numerals 4a and 4b do not perform a code demodulation operation in a strict sense, they are herein referred to as "code demodulators" for convenience of description. The code demodulators 4a and 4b described in the present embodiment are examples of a converter in the present disclosure. Although the code demodulators 4a and 4b have, for example, structures that are similar to that of the code demodulator 4 illustrated in FIG. 10, the code sequence of control signals d1 to d4 is different.

For example, in accordance with the amount of power supplied from the electric generator 1 and/or demands for powers in the loads 5a and 5b, the power transmission system 100A can supply power, which is different from the power generated by the electric generator 1, to the load 5a and/or the load 5b.

The electric generator 1 generates predetermined power. The code modulator 2 code-modulates the generated power. The code-modulated power is transmitted from the code modulator 2 to the code demodulators 4a and 4b through the transmission path 3. The code demodulators 4a and 4b convert the respective code-modulated powers with predetermined conversion codes. The converted powers are supplied to the loads 5a and 5b, respectively.

[2. Operation]

[2-1. Control of Effective Time Span]

Figure 14A:
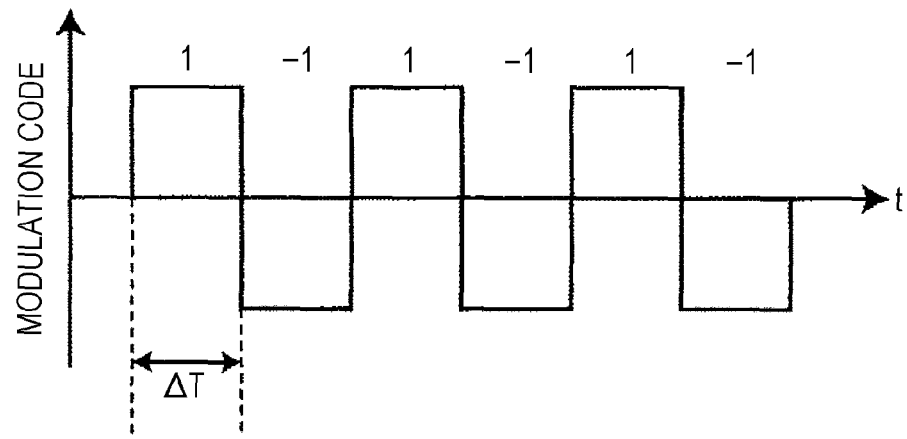
FIG. 14A is a schematic diagram illustrating one example of changes in a modulation code with time.

FIG. 14A is a schematic diagram illustrating changes in the modulation code with time. In FIG. 14A, ΔT represents a time span per bit of the modulation code. Now, suppose a case in which the code sequence of the demodulation code is equal to the code sequence of the modulation code, by way of example. In this case, FIG. 14A can be seen as exhibiting changes in the demodulation code with time.

Figure 14B:
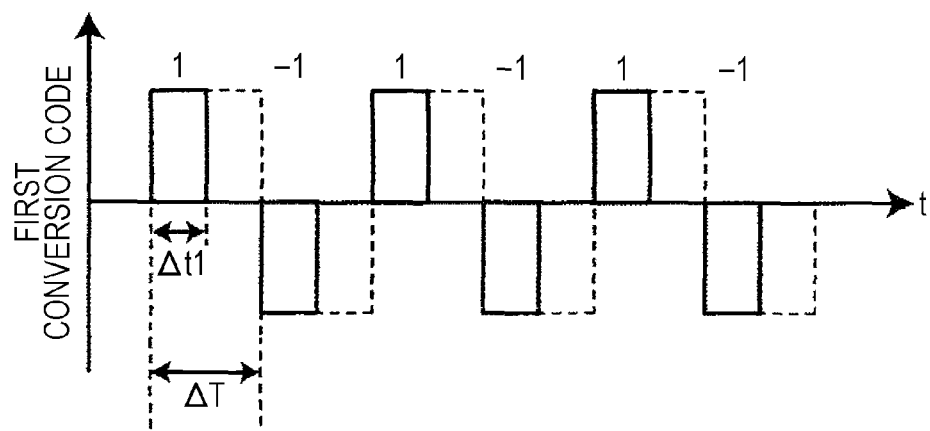
FIG. 14B is a schematic diagram illustrating one example of changes in a first conversion code with time according to the first embodiment.

For example, the controller 10A or the code demodulator 4a generates a conversion code illustrated in FIG. 14B, on the basis of the modulation code (or the demodulation code) illustrated in FIG. 14A. The conversion code illustrated in FIG. 14B indicates "1" or "−1" in a segment (a period $\Delta t1$ in FIG. 14B) in the period of the time span $\Delta T$. In accordance with the conversion code, for example, the code demodulator 4a repeats a set of a conversion operation and an intermission operation at every cycle $\Delta T$. During the intermission operation, the code demodulator 4a does not output power. Thus, the waveform of the generated power is periodically and partially restored. In other words, the code demodulator 4a intermittently and periodically outputs converted power. As a result, the amount of power supplied to the load 5a can be adjusted to a desired value.

In the present embodiment, the time span per bit of the conversion code means a duration (e.g., $\Delta t1$ in FIG. 14B) in which the code-modulated power is converted. In the present disclosure, this time span may be referred to as an "effective time span". The effective time span $\Delta t1$ satisfies $0<\Delta t1<\Delta T$ for the time span $\Delta T$ per bit of the modulation code.

[2-2. Example 1]

An example in which a 100 mA AC generated by the electric generator 1 is converted into a 50 mA DC, and the DC is supplied to the load 5a will now be described as Example 1.

In Example 1, the power transmission system 100A illustrated in FIG. 13 was used. The code modulator 2 had the circuit illustrated in FIG. 9, and each of the code demodulators 4a and 4b had the circuit illustrated in FIG. 10.

Control signals m1 to m4 for the code modulator 2 had the code sequences m1 to m4 illustrated in Table 3 described above. Control signals d1 to d4 for the code demodulator 4a had the code sequences illustrated in Table 4 described above. All of the switches in the code demodulator 4b were maintained in the OFF state.

The frequency of the control signals m1 to m4 was 35 kHz, and the time span $\Delta T$ per bit was about 14.3 (={1/(35 kHz)}/2)μs. The effective time span $\Delta t1$ of the control signals d1 to d4 was about 7.1 (=0.5×$\Delta T$) μs.

Figure 15A:
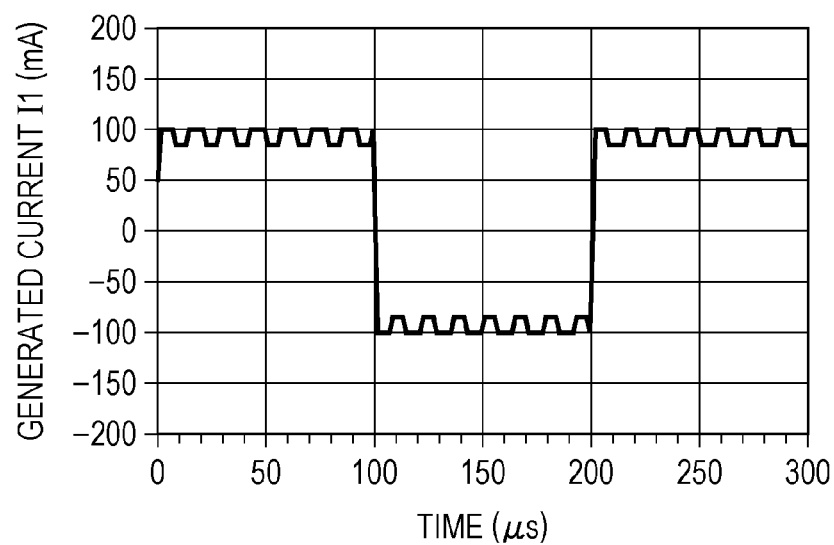
FIG. 15A is a graph illustrating the waveform of generated current according to Example 1 in the first embodiment.
Figure 15B:
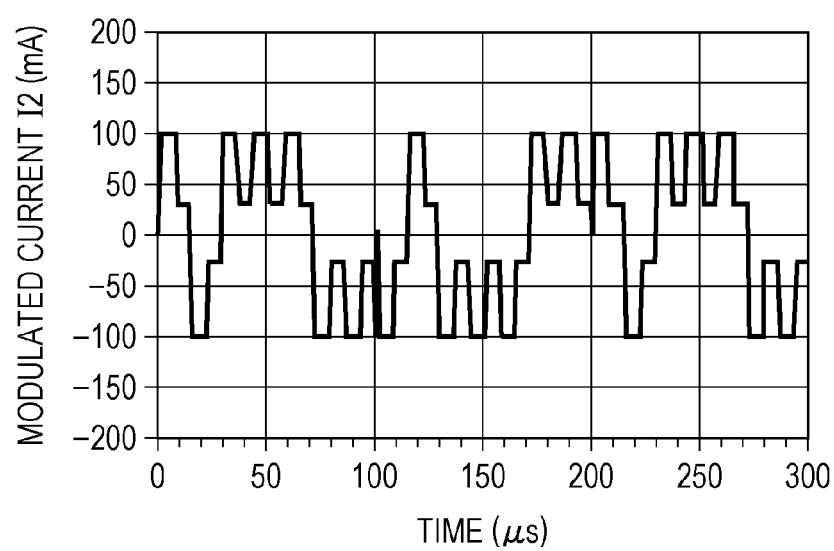
FIG. 15B is a graph illustrating the waveform of a modulated current according to Example 1 in the first embodiment.
Figure 15C:
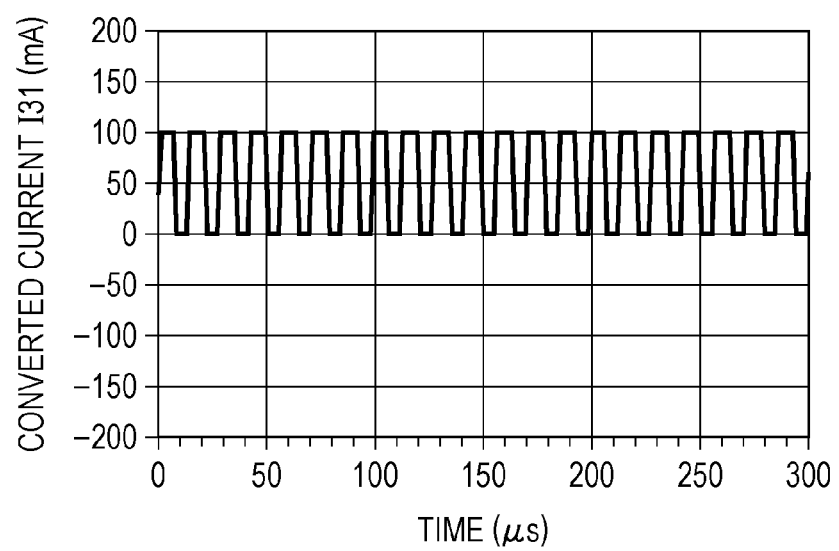
FIG. 15C is a graph illustrating the waveform of a converted current according to Example 1 in the first embodiment.

FIGS. 15A, 15B, and 15C illustrate the waveforms of a generated current I1, a modulated current I2, and a converted current I31, respectively, according to Example 1.

In FIG. 15C, the converted current I31 was a pulsed current that was repeated at a cycle of about 14.3 μs, the current value of each pulse was 100 mA, and the time span of each pulse was about 7.1 μs. The converted current I31 becomes, for example, a 50 mA DC through smoothing performed by a smoothing circuit.

It is noted that the waveforms illustrated in FIGS. 15A and 15B exhibit ripple current components, which is caused by reflection of some of the modulated current by the code demodulator 4b.

A supplemental description will be given of the relationship between the demodulation code and the conversion code in Example 1.

In a first half cycle (0 to 100 μs), the control signals d1 to d4 for the code demodulator 4a match the control signals m1 to m4 for the code modulator 2. That is, in the first half cycle, the control signals d1 to d4 cause the code demodulator 4a to periodically repeat a set of a code demodulation operation and an intermission operation. As a result, in the first half cycle, some of the positive generated current I2 is periodically restored as a positive current I31.

On the other hand, in a second half cycle (100 to 200 μs), the control signals d1 to d4 for the code demodulator 4a do not match the control signals m1 to m4 for the code modulator 2. Thus, the control signals d1 to d4 cause the code demodulator 4a to periodically repeat a set of a conversion operation, which is different from the demodulation operation, and an intermission operation. This conversion operation corresponds to an operation for code-demodulating the modulated current I2 and further reversing the direction of the current. As a result, in the second half cycle, some of the negative generated current I2 is periodically converted into the positive current I31. The conversion code in the second half cycle corresponds to a code obtained by bit-inverting the demodulation code in the second half cycle.

The "conversion code" in the present disclosure is not limited to only a code obtained by setting an effective time span for the demodulation code, but also includes a code obtained by setting an effective time span for a predetermined code based on the demodulation code.

[2-3. Complementary Control of Effective Time Span]

In the power transmission system 100A, the code demodulator 4b may perform a code demodulation operation, while the code demodulator 4a performs the above-described intermission operation. For example, the code demodulators 4a and 4b may convert the code-modulated power in a complementary manner.

Figure 14C:
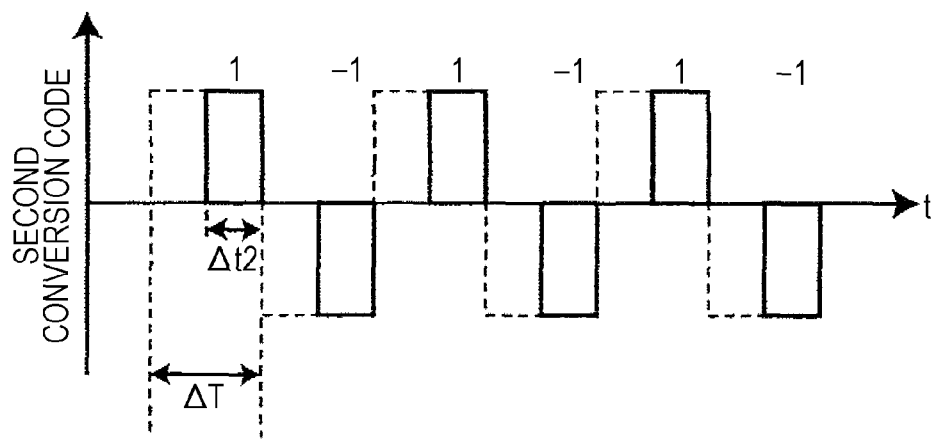
FIG. 14C is a schematic diagram illustrating one example of changes in a second conversion code with time according to the first embodiment.

For example, the controller 10A or the code demodulator 4b generates the conversion code illustrated in FIG. 14C, on the basis of the modulation code (or the demodulation code) illustrated in FIG. 14A. The conversion code illustrated in FIG. 14C indicates "1" or "−1" in a segment (a period $\Delta t2$ in FIG. 14C) in the period of the time span $\Delta T$. As illustrated in FIGS. 14B and 14C, the effective time span $\Delta t1$ of a first conversion code used in the code demodulator 4a and the effective time span $\Delta t2$ of a second conversion code used in the code demodulator 4b have a mutually complementary relationship. Thus, the code demodulators 4a and 4b alternately output code-modulated power. As a result, the amounts of power supplied to the loads 5a and 5b can be adjusted to desired values.

The effective time span $\Delta t1$ of the first conversion code, the effective time span $\Delta t2$ of the second conversion code, and the time span $\Delta T$ per bit of the modulation code satisfy, for example, the following relationship:

$$\Delta t1+\Delta t2 \leq \Delta T$$

$$0<\Delta t1<\Delta T$$

$$0<\Delta t2<\Delta T \qquad (8)$$

For example, when $\Delta t1+\Delta t2=\Delta T$ is satisfied, the code demodulators 4a and 4b operate in a completely complementary manner. For example, $\Delta t1=0.4\times\Delta T$ and $\Delta t2=0.6\times\Delta T$ may be satisfied, or $\Delta t1=0.6\times\Delta T$ and $\Delta t2=0.4\times\Delta T$ may be satisfied.

For example, when $\Delta t1+\Delta t2<\Delta T$ is satisfied, the code demodulators 4a and 4b operate at intervals of a predetermined dead time in a complementary manner. For example, $\Delta t1=0.4\times\Delta T$ and $\Delta t2=0.5\times\Delta T$ may be satisfied or $\Delta t1=0.5\times\Delta T$ and $\Delta t2=0.4\times\Delta T$ may be satisfied.

[2-4. Example 2]

An example in which some of a 100 mA AC generated by the electric generator 1 is converted into a 50 mA DC, this DC is supplied to the load 5a, the remainder is converted into a 50 mA DC, and this DC is supplied to the load 5a will be described as Example 2.

In Example 2, a power transmission system 100A that is the same as or similar to that in Example 1 was used. The control signals m1 to m4 for the code modulator 2 and the control signals d1 to d4 for the code demodulator 4a were analogous to those in Example 1.

Control signals d1 to d4 for the code demodulator 4b had the code sequences illustrated in Table 4 described above. The effective time span Δt2 of the control signals d1 to d4 was about 7.1 (=0.5×ΔT) µs.

FIGS. 16A, 16B, 16C, and 16D illustrate the waveforms of a generated current I1, a modulated current I2, a converted current I31, and a converted current I32, respectively, according to Example 2.

Figure 16A:
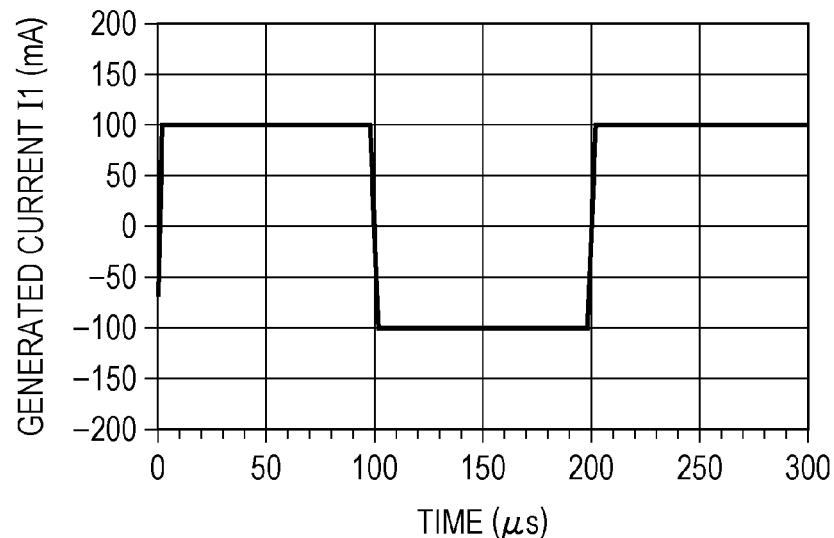
FIG. 16A is a graph illustrating the waveform of a generated current according to Example 2 in the first embodiment.
Figure 16B:
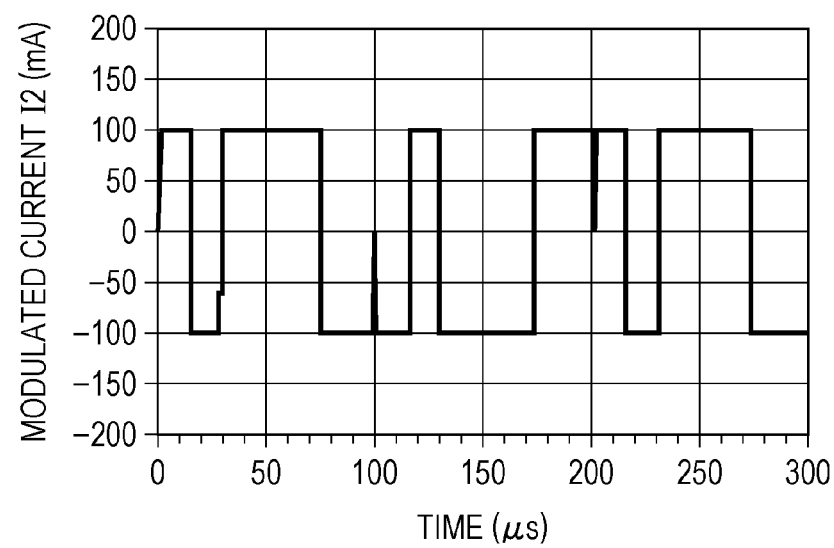
FIG. 16B is a graph illustrating the waveform of a modulated current according to Example 2 in the first embodiment.
Figure 16C:
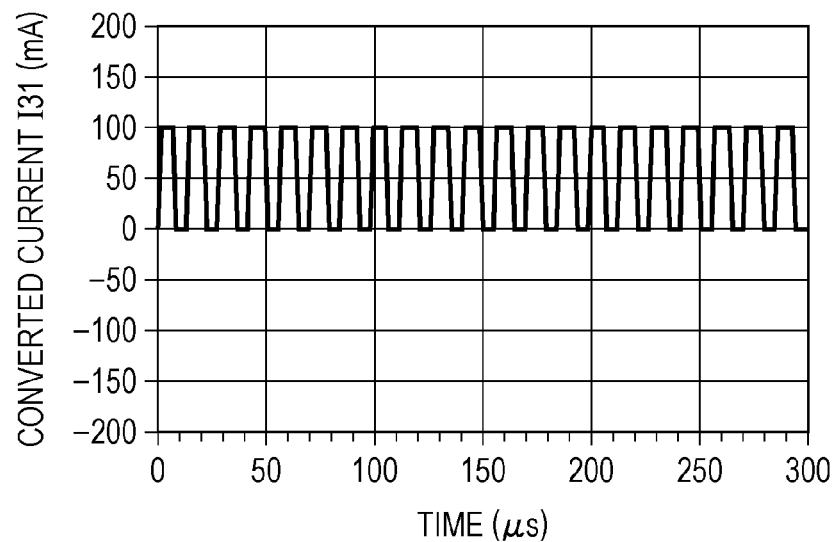
FIG. 16C is a graph illustrating the waveform of a first converted current according to Example 2 in the first embodiment.
Figure 16D:
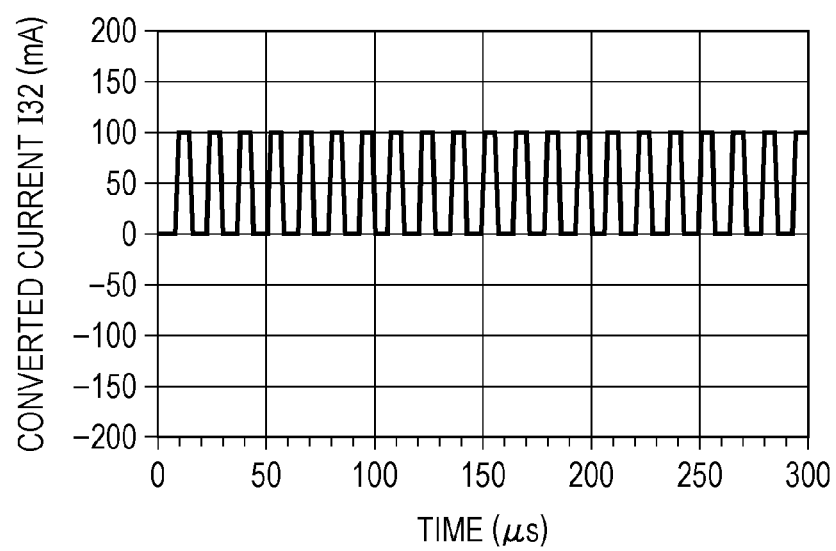
FIG. 16D is a graph illustrating the waveform of a second converted current according to Example 2 in the first embodiment.

Each of the converted current I31 in FIG. 16C and the converted current I32 in FIG. 16D was a pulsed current that was repeated at a cycle of about 14.3 µs. When the converted current I31 was 100 mA, the converted current I32 was 0 mA, and when the converted current I32 was 0 mA, the converted current I32 was 100 mA. Each of the converted currents I31 and I32 becomes, for example, a 50 mA DC through smoothing performed by a smoothing circuit.

Second Embodiment

The following description will be given of a second embodiment, particularly, points that are different from the reference modes and the first embodiment. A power transmission system according to the second embodiment is the same as or similar to the power transmission system according to the first embodiment.

[1. Operation]
[1-1. Change in Degree of Correlation Between a Modulation Code and a Demodulation Code]

Figure 17:
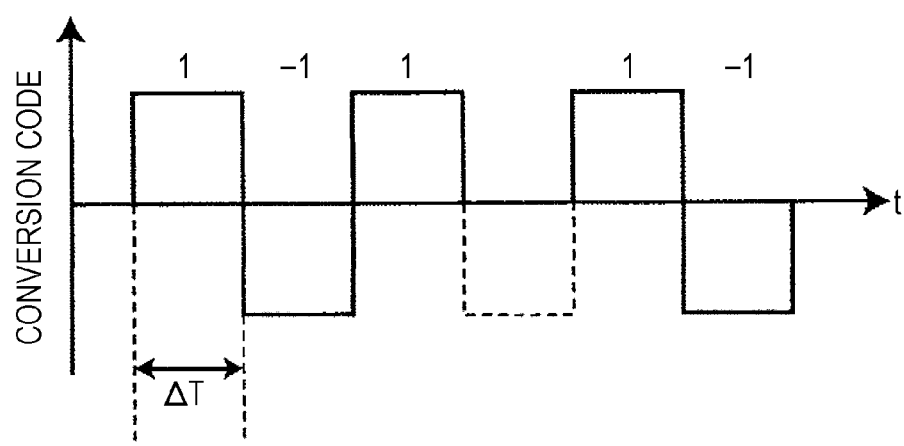
FIG. 17 is a schematic diagram illustrating one example of changes in a conversion code with time according to a second embodiment.

FIG. 17 is a schematic diagram illustrating changes in the conversion code with time. Now, suppose a case in which the code sequence of the demodulation code is equal to the code sequence of the modulation code, by way of example. In this case, the conversion code illustrated in FIG. 17 corresponds to a code obtained by changing the fourth bit of the code sequence of the demodulation code illustrated in FIG. 14A. In accordance with the conversion code, for example, the code demodulator 4a intermits operating in a period corresponding to the fourth bit and performs a code demodulation operation in periods corresponding to the other bits. As a result, the waveform of the generated power is partially restored. In other words, the code demodulator 4a intermittently performs a conversion operation to thereby intermittently output converted power. As a result, the amount of power supplied to the load 5a can be adjusted to a desired value.

The conversion code is generated, for example, by modifying some of the demodulation code corresponding to the modulation code. The conversion code has a predetermined degree of correlation with the demodulation code. The degree of correlation between the conversion code and the demodulation code is a rate at which the bit values of the conversion code match the corresponding bit values of the demodulation code or the modulation code. The degree of correlation is larger than 0 and is smaller than 1. When the number of bits of the conversion code is represented by N, the degree of correlation can take a discrete value i/N (i= 1 . . . , N−1). The minimum value of the degree of correlation is 1/N, and the maximum value thereof is (N−1)/N. When a relatively large power is transmitted, for example, the degree of correlation may be larger than 0.5 and be smaller than 1 or may be larger than 0.7 and be smaller than 1. On the other hand, when a relatively small power is transmitted, for example, the degree of correlation may be larger than 0 and be smaller than 0.3 or may be larger than 0 and be smaller than 0.5.

[1-2. Example Operation]

In this example operation, a description will be given of an example in which DC generated by the electric generator 1 is converted into current having a predetermined waveform, and the current is supplied to the load 5a.

The power transmission system 100A illustrated in FIG. 13 is used in this example operation. The code modulator 2 includes the H-bridge circuit 23 and the control circuit 25 illustrated in FIG. 7. Each of the code demodulators 4a and 4b has the H-bridge circuit 33 and the control circuit 35 illustrated in FIG. 7.

Control signals m1 and m2 for the code modulator 2 and control signals d1 and d2 for the code demodulator 4a have, for example, code sequences illustrated in Table 5 below. All of the switches in the code demodulator 4b are maintained, for example, in the OFF state.

TABLE 5

| CONTROL SIGNAL | CODE SEQUENCE |
|---|---|
| m1 | [1 0 1 1 1 0 0 1 0 0] |
| m2 | [0 1 0 0 0 1 1 0 1 1] |
| d1 | [1 0 1 0 1 0 0 1 1 0] |
| d2 | [0 1 0 1 0 1 1 0 0 1] |

In Table 5, the fourth bit in the control signal d1 corresponds to an inverted bit of the fourth bit of the control signal m1, and the fourth bit in the control signal d2 corresponds to an inverted bit of the fourth bit of the control signal m2. The ninth bit in the control signal d1 corresponds to an inverted bit of the ninth bit of the control signal m1, and the ninth bit in the control signal d2 corresponds to an inverted bit of the ninth bit of the control signal m2. The bits other than the fourth and ninth bits in the control signal d1 match the corresponding bits in the control signal m1, and the bits other than the fourth and ninth bits in the control signal d2 match the corresponding bits in the control signal m2. As a result, the code demodulator 4a does not output current in the periods corresponding to the fourth and ninth bits and outputs demodulated current in periods corresponding to the other bits.

Other Embodiments

The present disclosure is not limited to the specific examples described above in the reference modes and the embodiments. The disclosed technology is not limited to the specific examples described above in the various modes and also encompasses any modes obtained by performing a change, replacement, addition, omission, and so on to those modes, as appropriate. The present disclosure encompasses a combination of a plurality of modes.

Although, in the first and second reference modes and the first embodiment, the code sequence of the control signals, the code sequence of the modulation code, the code sequence of the demodulation code, and the code sequence of the conversion code each include one or more orthogonal Gold sequences, the present disclosure is not limited thereto. For example, the modulation code, the demodulation code, and/or the conversion code may include another orthogonal code. Examples of the other orthogonal code include an m sequence.

Although, in the first and second reference modes and the first embodiment, each code length of the control signals, the modulation code, the demodulation code, and the conversion code is 7 bits or 14 bits, the present disclosure is not limited thereto. Although the control signal is 10 bits in the second embodiment, the present disclosure is not limited thereto. The larger the code length, the larger the number of orthogonal codes that can be generated. When the code length is increased, the correlation decreases to thereby make it possible to more accurately split power.

Although, in the first embodiment and examples 1 and 2, the code modulator and the code demodulator have been described as being the respective circuits illustrated in FIGS. 9 and 10, they may be implemented by, for example, the circuit illustrated in FIG. 7. In such a case, the circuit configuration of the code modulator and the code demodulator is simplified, thereby making it possible to realize a reduction in cost and a reduction in the size of the apparatus. Although, in the example operation of the second embodiment, the code modulator and the code demodulator have been described above as being the circuits illustrated in FIG. 7, they may be, for example, the circuits illustrated in FIGS. 9 and 10.

The code demodulator exemplified in each of the first and second reference modes and the first and second embodiments may be used in any power transmission system and is not limited to a particular system.

Although, in each of the first and second reference modes and the first and second embodiments, the controller has been described as being located external to the code modulator and the code demodulator, the present disclosure is not limited thereto. At least one of the functions of the controller may be incorporated into at least one of the code modulator and the code demodulator.

Although an example in which the current is code-modulated and code-demodulated has been described in the first and second reference modes and the first and second embodiments, the voltage may be code-modulated and code-demodulated or the current and the voltage may be modulated and demodulated.

Although an example in which the generated current is input to the code modulator has been described in the first and second reference modes and the first and second embodiments, the generated current is one example of "input power".

Although an example in which the bidirectional switch circuit includes two switches has been described in the second reference mode, the bidirectional switch circuit may be implemented by, for example, a single bidirectional switch.

Although the power transmission system having one electric generator and two loads has been described in the first and second embodiments by way of example, the number of electric generators and the number of loads are not limited thereto.

When the power transmission system has a plurality of code modulators and a plurality of code demodulators, a plurality of code-modulated powers can be concurrently transmitted through the same transmission path. In this case, for example, when the transmission path is a cable, it is possible to reduce the number of cables. Also, the transmission time can be reduced compared with a scheme in which powers in a plurality of channels are transmitted in a time-division manner. In addition, according to the code modulation and demodulation scheme, since each power is transmitted independently, the power transmission can be performed without affecting transmission of the other power.

Accordingly, pairing between the code modulator and the code demodulator can be flexibly changed in accordance with a combination of a modulation code and a demodulation code. Thus, even when the number of pairing patterns increases, an increase in the circuit scale can be suppressed. Accordingly, it is possible to realize power transmission with an apparatus having a reduced size.

In the first and second reference modes and the first and second embodiments, each transmission path may be a wired transmission path or a wireless transmission path or may be a combination of a wired transmission path and a wireless transmission path.

Figure 18:
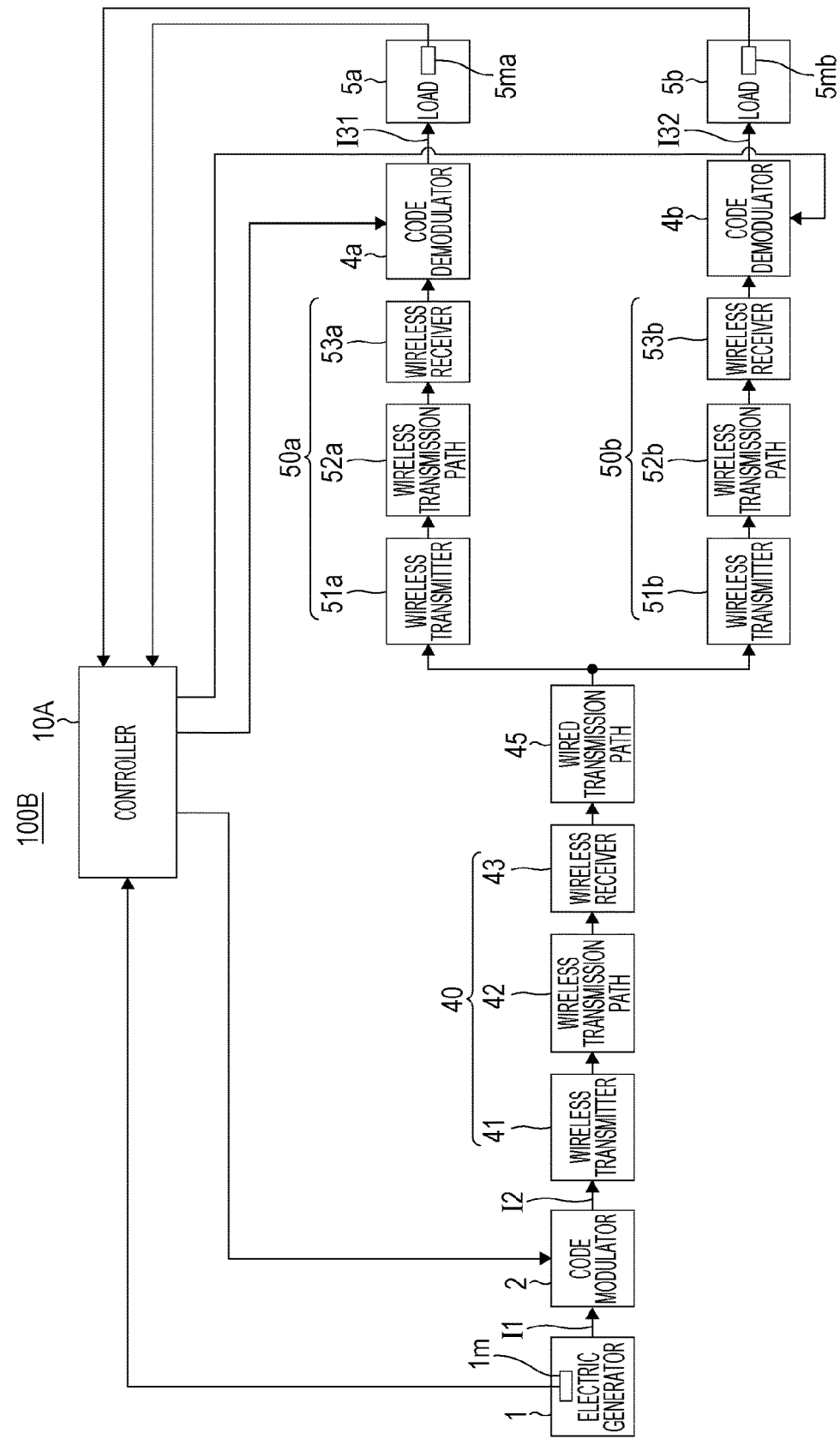
FIG. 18 is a block diagram illustrating an example configuration of a power transmission system according to a modification of the first and second embodiments.

FIG. 18 illustrates the configuration of a power transmission system 100B according to a modification of the first and second embodiments. The power transmission system 100B includes wireless systems 40, 50a, and 50b and a wired transmission path 45. One end of the wired transmission path 45 is connected to the wireless system 40, and another end of the wired transmission path 45 is branched into a plurality of transmission paths, which are connected to the respective wireless systems 50a and 50b. The wireless system 40 includes a wireless transmitter 41, a wireless transmission path 42, and a wireless receiver 43. The wireless system 50a includes a wireless transmitter 51a, a wireless transmission path 52a, and a wireless receiver 53a. The wireless system 50b includes a wireless transmitter 51b, a wireless transmission path 52b, and a wireless receiver 53b.

The wireless transmitter 41 modulates a predetermined carrier wave in accordance with input code-modulated power by using a predetermined modulation scheme and wirelessly transmits a modulated wave to the wireless receiver 43 through the wireless transmission path 42. The wireless receiver 43 receives the wirelessly transmitted wave through the wireless transmission path 42, demodulates the wave by using a corresponding demodulation scheme, and outputs a demodulated wave. In each of the wireless systems 50a and 50b, a similar operation is performed. Examples of the modulation scheme for the wireless transmission include an amplitude modulation scheme and a phase-shift keying (PSK) modulation scheme.

Overview of Embodiments

A power receiving apparatus according to a first aspect is directed to a power receiving apparatus that receives a AC code-modulated wave including power through a wired transmission line, the code-modulated wave being transmitted from a power transmitting apparatus having a code modulator that generates the AC code-modulated wave by code-modulating first power through use of a predetermined modulation code, the power receiving apparatus including: a code demodulator that code-demodulates the received AC code-modulated wave through use of a demodulation code different from a demodulation code corresponding to the modulation code, converts the code-demodulated wave into second power having an amount of power different from an amount of the first power, and that outputs the second power.

A power receiving apparatus according to a second aspect is configured so that, in the power receiving apparatus according to the first aspect, the demodulation code used in the code demodulation have an effective time span that is smaller than an effective time span of the modulation code to thereby adjust the second power.

A power receiving apparatus according to a third aspect is configured so that, in the power receiving apparatus according to the first aspect, at least some of the demodulation code used in the code demodulation are changed from the modulation code to thereby adjust the second power.

A power receiving apparatus according to a fourth aspect has a feature that, in the power receiving apparatus according to one of the first to third aspects, the modulation code and the demodulation code are a predetermined orthogonal code.

A power transmission system according to a fifth aspect includes: a power transmitting apparatus having a code modulator that generates an AC code-modulated wave by code-modulating first power through use of a predetermined modulation code; and the power receiving apparatus according to one of the first to fourth aspects.

A power transmission system according to a sixth aspect has a feature that, in the power transmission system according to the fifth aspect, the first power is AC power, and the second power is at least one of DC power and AC power.

A power transmission system according to a seventh aspect has a feature that, in the power transmission system according to the fifth or sixth aspect, instead of transmitting the power from the power transmitting apparatus to the power receiving apparatus, a code modulator in the power transmitting apparatus is used as a code demodulator and a code demodulator in the power receiving apparatus is used as a code modulator to thereby transmit the power in an opposite direction.

A power transmission system according to an eighth aspect has a feature that, in the power transmission system according to one of the fifth to seventh aspects, the code modulator has a first generation circuit that generates the modulation code, and the code demodulator has a second generation circuit that generates the demodulation code.

A power transmission system according to a ninth aspect has a feature that, in the power transmission system according to the eighth aspect, the power transmission system includes a controller that controls the power transmission system; the controller outputs, to the code modulator, a modulation start time, a modulation end time, and a control signal for generating the modulation code; the controller outputs, to the code demodulator, a demodulation start time, a demodulation end time, and a control signal for generating the demodulation code; the code modulator code-modulates the first power, based on the modulation start time, the modulation end time, and the control signal for generating the modulation code; and the code demodulator code-demodulates the first power into the second power, based on the demodulation start time, the demodulation end time, and the control signal for generating the demodulation code.

A power transmission system according to a tenth aspect has a feature that, in the power transmission system according to the ninth aspect, the power transmitting apparatus has a first power measuring means that measures the amount of the first power, and the power receiving apparatus has a second power measuring means that measures the amount of the second power.

A power transmission system according to an 11th aspect has a feature that, in the power transmission system according to the tenth aspect, the power transmission system includes a plurality of code modulators and a plurality of code demodulators, and based on the amount of the first power measured by the first power measuring means and the amount of the second power measured by the second power measuring means, the controller controls operations of the plurality of code modulators and the plurality of code demodulators, to thereby flexibly transmit power between a power channel of the plurality of code modulators and a power channel of the plurality of code demodulators.

A power transmission system according to a 12th aspect includes, in the power transmission system according to the 11th aspect, at least one of: a first wireless power transmission system provided between the code modulator in the power transmitting apparatus and the wired transmission line; and a second wireless power transmission system provided between the wired transmission line and the code demodulator in the power receiving apparatus.

A power transmission system according to a 13th aspect includes: a code modulator that generates code-modulated power by code-modulating input power with a modulation code; and a wireless transmitter that transmits the code-modulated power.

A power transmission system according to a 14th aspect includes: a wireless receiver that receives code-modulated power; and a code demodulator that generates output power by code-demodulating the code-modulated power with a demodulation code.

A power transmission system according to a 15th aspect includes: the code modulator and the wireless transmitter according to the 13th aspect and the wireless receiver and the code demodulator according to the 14th aspect.

A power transmission system according to a 16th aspect further includes, in a power transmission system according to a 15th aspect, another wireless receiver that receives the code-modulated power transmitted from the wireless transmitter; a wired transmission line connected to the other wireless receiver; and another wireless transmitter connected to the wired transmission line to transmit the code-modulated power to the wireless receiver.

According to the present disclosure, in the power transmission system, combinations of electric generators, which serve as power transmission sources, and power loads, which serve as power transmission destinations, and amounts of power to be flexibly transmitted are actively specified, and then flexible power transmission can be concurrently and independently performed between the combinations through one power wired transmission line.

The power transmission system according to the present disclosure is useful for power transmission from an electric generator, such as a photovoltaic generator, a wind power generator, or a hydroelectric power generator to a train, an electric vehicle (EV), or the like.

What is claimed is:
1. A converter comprising:
   a terminal that receives code-modulated power that has been generated with a modulation code, the code-modulated power being alternating-current power; and
   a circuit that intermittently converts the code-modulated power with a conversion code based on the modulation code.
2. The converter according to claim 1,
   wherein the conversion code is generated from a demodulation code corresponding to the modulation code.
3. The converter according to claim 1,
   wherein the circuit intermittently converts the code-modulated power to repeatedly output pulse power in a cycle equal to a time span per bit of the modulation code.
4. The converter according to claim 3,
   wherein the circuit
      converts, during a part of the cycle, the code-modulated power into the pulse power with a corresponding bit of the conversion code, and
      outputs, during another part of the cycle, no power.

5. The converter according to claim 1,
wherein the circuit
converts the code-modulated power with a part of bits of the conversion code, and
outputs no power in accordance with another part of bits of the conversion code.

6. The converter according to claim 1,
wherein a rate at which bit values of the conversion code match corresponding bit values of the modulation code is larger than 0.5 and is smaller than 1.

7. The converter according to claim 1,
wherein the circuit includes switches.

8. The converter according to claim 7, further comprising:
a control circuit that generates a plurality of control signals for turning on and off the switches,
wherein the circuit intermittently converts the code-modulated power in accordance with the control signals.

9. The converter according to claim 1,
wherein the modulation code includes an orthogonal code.

10. A controller comprising:
a processor that generates a first instruction signal for code-modulating first power into code-modulated power with a modulation code, and generates a second instruction signal for intermittently converting the code-modulated power with a first conversion code based on the modulation code, the code-modulated power being alternating-current power; and
a communication circuit that transmits the first instruction signal to a code modulator, and transmits the second instruction signal to a first converter that is connected with the code modulator through a transmission path.

11. The controller according to claim 10,
wherein the processor further generates the conversion code from a demodulation code corresponding to the modulation code.

12. The controller according to claim 10,
wherein the processor further sets a time span per bit of the conversion code to be shorter than a time span per bit of the modulation code.

13. The controller according to claim 11,
wherein the processor further generates the conversion code by changing at least one bit of the demodulation code.

14. The controller according to claim 11,
wherein the processor further generates a third instruction signal for intermittently converting the code-modulated power with a second conversion code based on the modulation code, and
the communication circuit further transmits the third instruction signal to a second converter that is connected with the code modulator through the transmission path.

15. The controller according to claim 14,
wherein the processor causes the first converter and the second converter to alternately convert the code-modulated power.

* * * * *